United States Patent [19]

Iwahashi

[11] Patent Number: 5,610,858
[45] Date of Patent: Mar. 11, 1997

[54] NON-VOLATILE SEMICONDUCTOR MEMORY DEVICE AND METHOD OF MANUFACTURING THE SAME

[75] Inventor: Hiroshi Iwahashi, Yokohama, Japan

[73] Assignee: Kabushiki Kaisha Toshiba, Tokyo, Japan

[21] Appl. No.: 440,471

[22] Filed: May 12, 1995

[30] Foreign Application Priority Data

May 12, 1994 [JP] Japan .................................. 6-098589

[51] Int. Cl.[6] .................................................. G11C 11/34
[52] U.S. Cl. ............................... 365/185.05; 365/185.01; 365/185.18; 365/185.33
[58] Field of Search ......................... 365/185.01, 185.05, 365/185.1, 185.18, 185.33

[56] References Cited

U.S. PATENT DOCUMENTS 4,173,766  11/1979  Hayes .
4,794,564  12/1988  Watanabe .
5,274,587  12/1993  Koyama ............................ 365/185.33
5,278,439   1/1994  Ma et al. .
5,473,564  12/1995  Kowalski ........................... 365/185.01

*Primary Examiner*—David C. Nelms
*Assistant Examiner*—Huan Hoang
*Attorney, Agent, or Firm*—Loeb & Loeb LLP

[57] ABSTRACT

Memory cells, each formed of an EEPROM, are series-connected with transistors. Blocks, each of which is constructed by one memory cell and one transistor connected in series, are arranged in a matrix form. The memory cell and transistor of each block are controlled by different row lines. The memory cell and transistor of each block are connected to different column lines, and the column line connected to the memory cell of one of the adjacent blocks which are controlled by the same row line is connected to the transistor of the other block.

19 Claims, 11 Drawing Sheets

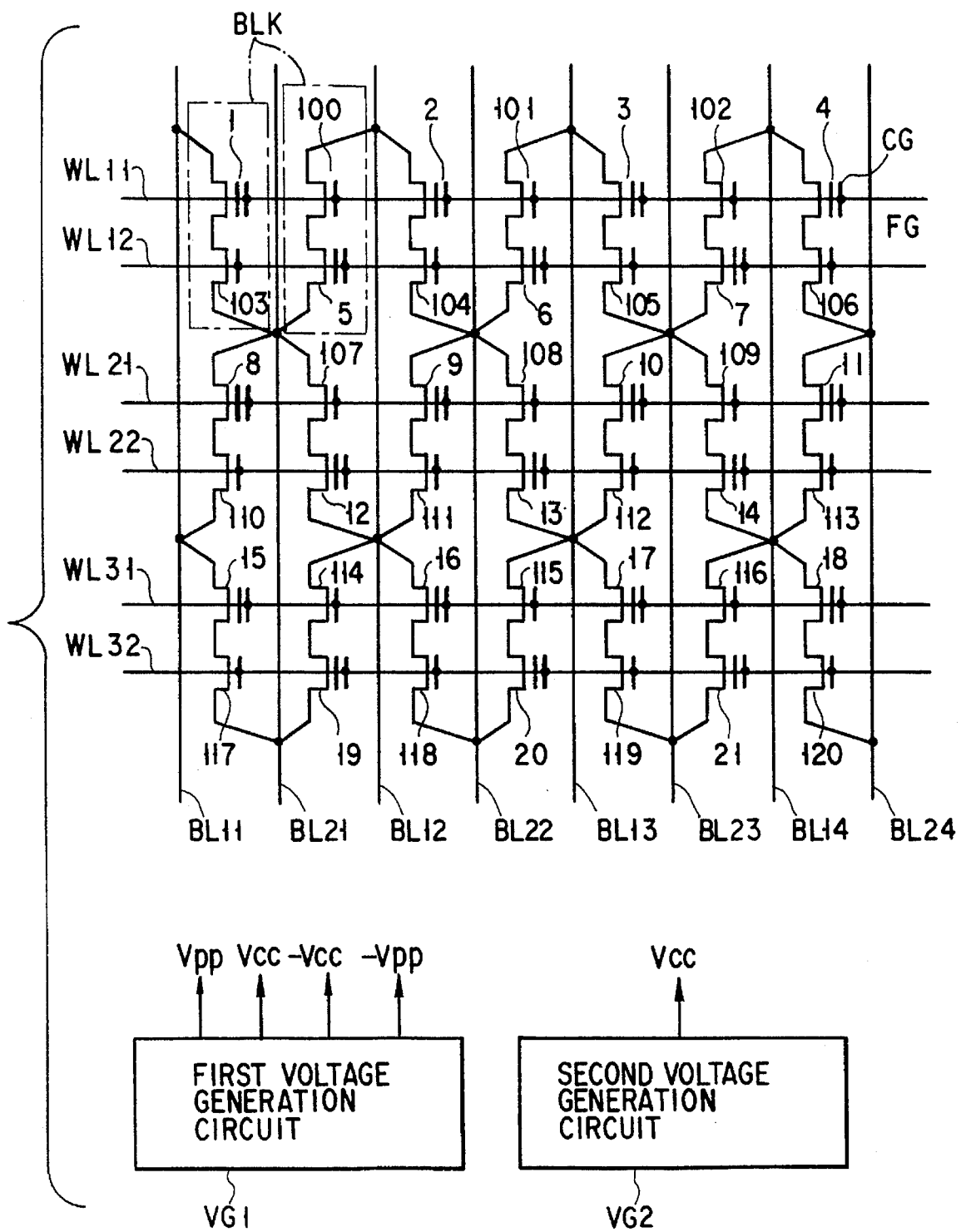
F I G. 1

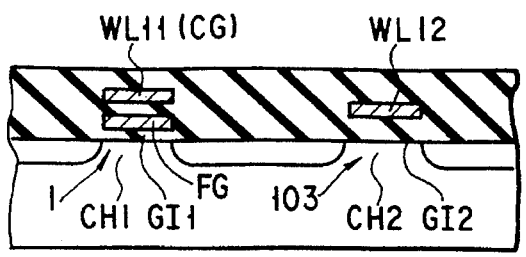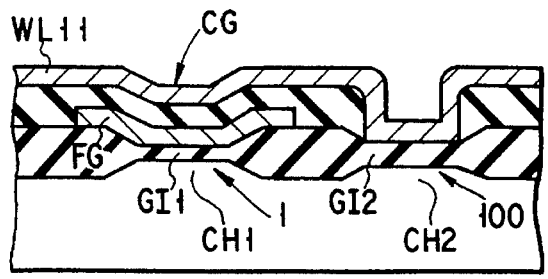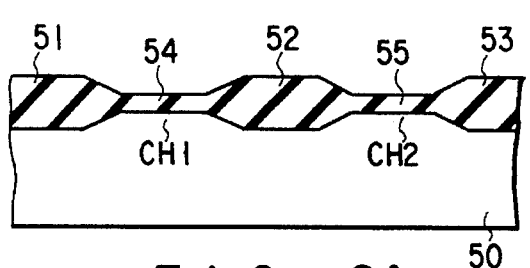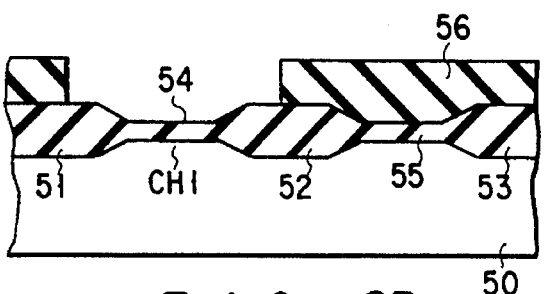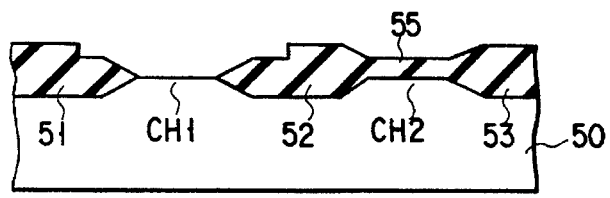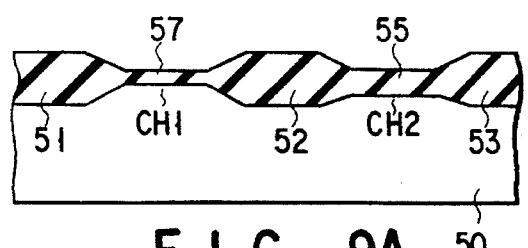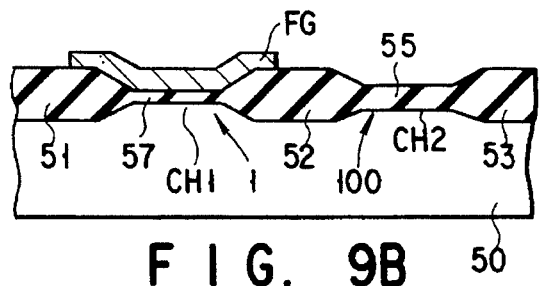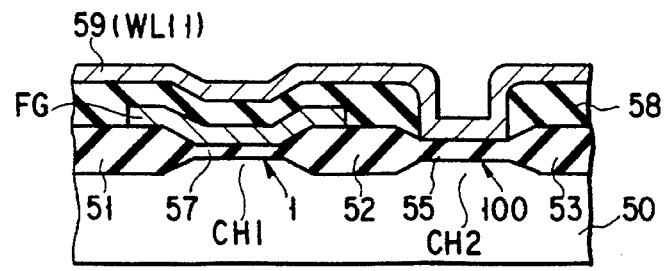

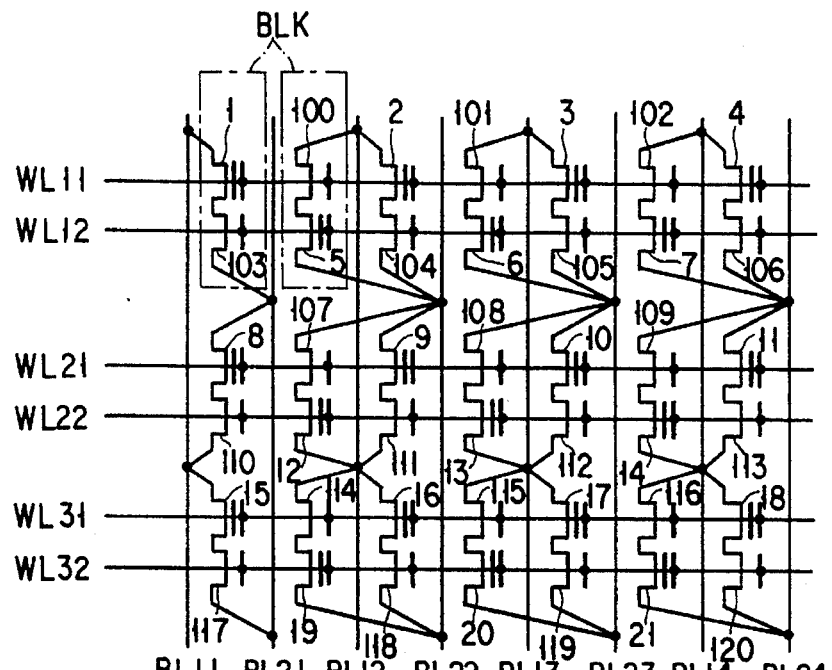
F I G. 13
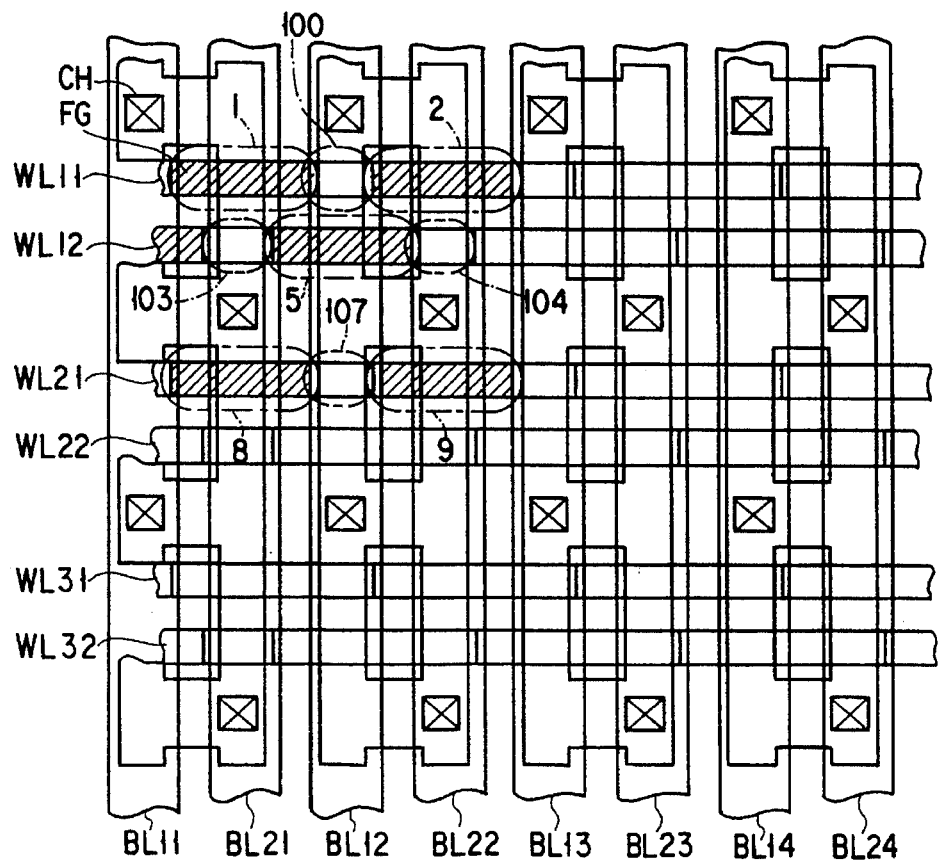
F I G. 14

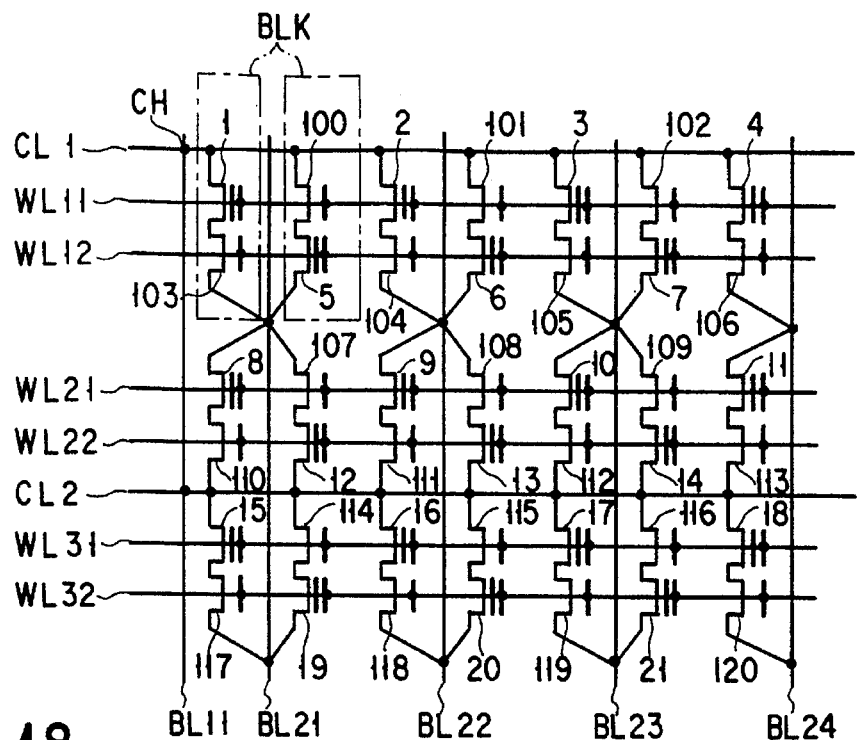
F I G. 18
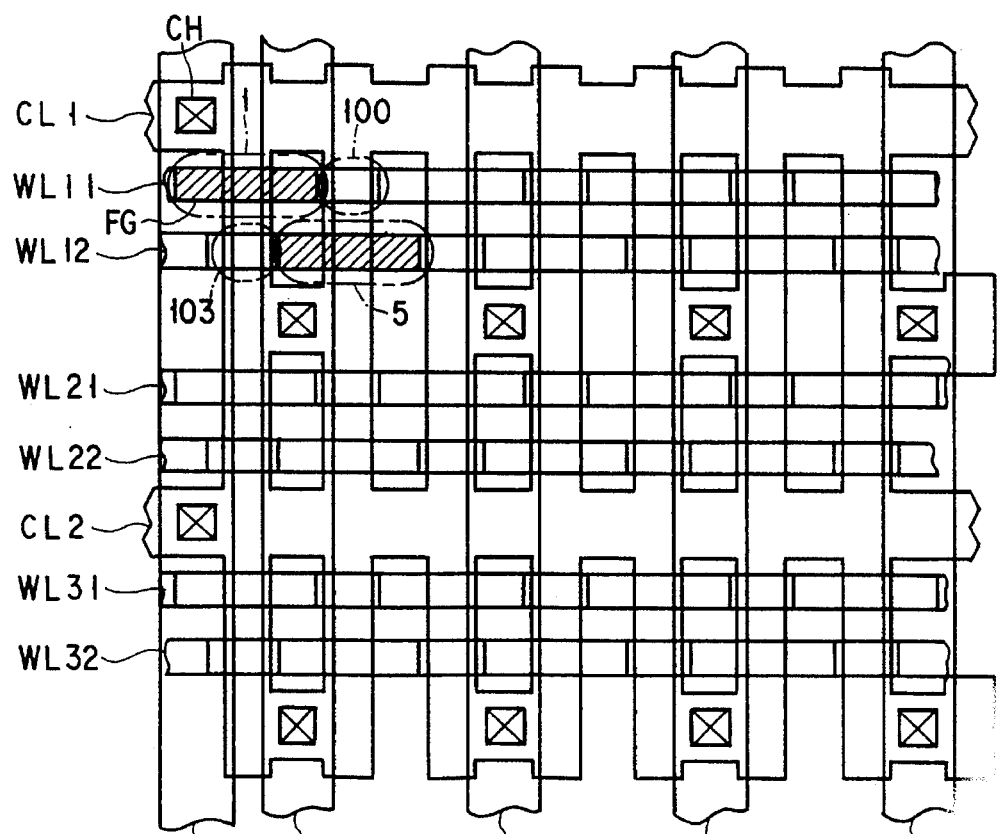
F I G. 19

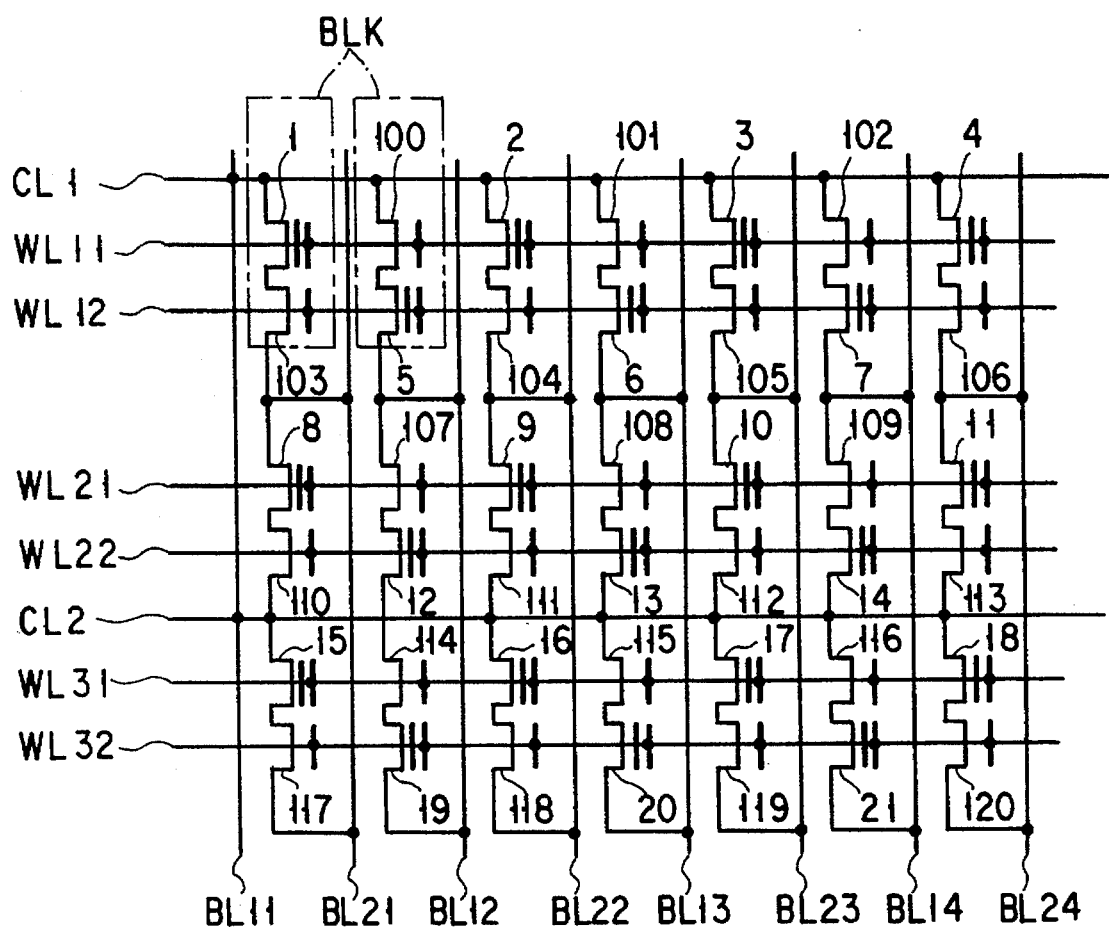
F I G. 20

NON-VOLATILE SEMICONDUCTOR MEMORY DEVICE AND METHOD OF MANUFACTURING THE SAME

BACKGROUND OF THE INVENTION

1. Field of the Invention

This invention relates to a non-volatile semi-conductor memory such as an EEPROM (Electrically Erasable Programmable Read Only Memory) in which data can be electrically rewritten.

2. Description of the Related Art

An EEPROM is formed such that a MOS transistor having a floating gate and a control gate is used as a memory cell, and a gate insulation film lying under the floating gate is made thin enough to cause a tunnel effect. When data is programmed, for example, the control gate is set to 0 V and a voltage of approx. 12 V is applied to a source or drain of the memory cell to emit electrons from the floating gate to the drain or source so as to initialize data stored in the memory cell. Then, data is selectively written into the memory cell by applying a high voltage to the control gate, setting the potential of the source to 0 V and applying a high voltage to the drain or setting the potential of the drain to 0 V. That is, if a high voltage is applied to the drain, a current flows into the memory cell and electrons generated at this time are injected into the floating gate. When the potential of the drain is kept at 0 V, no electrons are generated and the floating gate is kept in the initialized state. Thus, a binary data is stored according to the state in which electrons are injected into the floating gate or the initialized state of the floating gate. The threshold voltage of the memory cell is so set that a selected memory cell can be made conductive and a non-selected memory cell will be kept in the non-conductive state when the floating gate is kept in the initialized state. On the other hand, the threshold voltage of the memory cell is so set that the memory cell can always be set in the non-conductive state irrespective whether the memory cell is selected or not when electrons are injected into the floating gate.

FIGS. 10 and 11 show the conventional EEPROM having a plurality of memory cells which are the same as the above-described memory cell and arranged in a matrix form and FIG. 12 shows the cross section taken along the line 12—12 of FIG. 11.

As shown in FIG. 10, the memory cells M are arranged in a matrix form, the sources thereof are connected to a source line SL, the control gates of the memory cells which are arranged on the same row are connected to a corresponding one of row lines WL1 to WL4 and the drains of the memory cells which are arranged on the same column are connected to a corresponding one of column lines BL1 to BL3. With this construction, when data is initialized, electrons are first injected into the floating gates of all of the memory cells. Then, the row lines WL1 to WL4 are set to 0 V and the source line SL is set to a high voltage to emit electrons from the floating gates. If electrons of an excessive amount are emitted at the time of emission of electrons, the threshold voltage of the memory cell is set to a negative value. The memory cell having the negative threshold voltage will be made conductive even in the non-selected state. As a result, even when a memory cell which has electrons injected into the floating gate thereof and which is set in the non-conductive state is selected, a current flows out from a non-selected memory cell whose threshold voltage is negative, thereby making it impossible to correctly read out data.

Therefore, when electrons are emitted from the floating gate of the memory cell, the emission state of electrons emitted from the floating gate is checked by reading out data from the memory cell after electrons are emitted for a preset period of time. If it is detected that the amount of emitted electrons is insufficient as the result of checking, electrons are emitted from the floating gate again, then data is read out, and thus, the operations of emission of electrons and data readout are repeatedly performed until the threshold voltage of the memory cell is set to an adequate value.

Thus, in the conventional EEPROM, since it is necessary to repeatedly perform the operations of emission of electrons and data readout, a control circuit for effecting the complicated control operation is required. Therefore, it becomes necessary to use a large-scale peripheral circuit, thereby increasing the chip size.

Further, the threshold voltages of the memory cells are not equal to one another and vary in a preset range after the emission of electrons from the floating gate. The threshold voltage of the memory cell is preferably set at a low level in order to enhance the data readout speed. However, since it is required to prevent the lowest threshold voltage from being set to be negative, the highest threshold voltage becomes a certain level. The degree of variation in the threshold voltage of the memory cell depends on a variation in the thickness of the gate insulation film of the memory cell and becomes different for each chip or manufacturing lot for some reasons caused in the manufacturing process. The data readout speed from the memory cell in which the degree of variation in the threshold voltage is small is high, but the data readout speed from the memory cell in which the degree of variation in the threshold voltage is large is not high. This phenomenon indicates that the difference in the data readout speed is further increased when a power supply voltage of 3 V is used as in the recent cases.

For example, a case wherein the threshold voltages of the memory cells in one chip vary between 1 V and 2 V is considered. When a power supply voltage of 5 V is used, a voltage of 5 V is applied to the control gate of a selected memory cell. Accordingly, since a current in the memory cell varies in proportion to a value obtained by subtracting the threshold voltage from the gate voltage of the memory cell when this case is briefly considered, the current varies between values corresponding to (5 V - 1 V) and (5 V - 2 V). Consequently, the ratio of the current in the memory cell in which the largest current flows to the current in the memory cell in which the smallest current flows is 4 V/3 V=1.33. However, if the power supply voltage is 3 V, the ratio of the currents becomes 2 V/1 V=2 and thus the degree of a variation in the current becomes larger. As a result, the degree of a variation in the data readout speed becomes larger.

SUMMARY OF THE INVENTION

An object of this invention is to provide a non-volatile semiconductor memory in which it is not necessary to repeatedly perform the operations of emitting electrons from the floating gate and checking the amount of emitted electrons, the peripheral control circuit can be made simple in construction, and the data readout speed can be prevented from being lowered even when the power supply voltage is lowered, and a method for manufacturing the same.

The above object can be attained by a non-volatile semiconductor memory device comprising a first row line; a first memory cell connected at one end to a first column line and selectively driven by the first row line; a first transistor connected at one end to a second column line and selectively driven by the first row line; a second row line; a second transistor connected at one end to the other end of the first memory cell, connected at the other end to a third column line and selectively driven by the second row line; and a second memory cell connected at one end to the other end of the first transistor, connected at the other end to the third column line and selectively driven by the second row line.

In the non-volatile semiconductor memory device of this invention, each of the first and second memory cells has a floating gate and a control gate. When data is programmed into the first and second memory cells, a high voltage is applied to the first and second row lines to set the potentials of the control gates of the first and second memory cells to a high voltage which is positive with respect to the semiconductor substrate in which the memory cells are formed. Then, electrons are injected into the floating gates and the first and second memory cells are set into the first data storing state. In this state, if a voltage which is negative with respect to the semi-conductor substrate is applied to the first or second row line to set the control gate of the first or second memory cell to a negative potential and a voltage which is positive with respect to the semiconductor substrate is selectively applied to the first or third column line to selectively emit electrons from the floating gate thereof, then the first and second memory cells are set into the second data storing state.

When data is programmed into the first and second memory cells, a high voltage which is negative with respect to the semiconductor substrate in which the memory cells are formed is applied to the first and second row lines to set the potentials of the control gates of the first and second memory cells to a negative high potential level. Then, electrons are emitted from the floating gates and the first and second memory cells are set into the first data storing state. In this state, a voltage which is positive with respect to the semiconductor substrate is applied to the first row line to set the control gate of the first memory cell to a positive potential and a first preset voltage or a second preset voltage which is higher than the first preset voltage is applied to the first column line. When the first preset voltage is applied, electrons are injected into the floating gate of the first memory cell and the first memory cell is set into the second data storing state. When the second preset voltage is applied, the first memory cell is kept in the first data storing state.

The non-volatile semiconductor memory device of this invention includes a transistor having a first insulation film disposed between a gate and a second channel region, and a memory cell having a second insulation film which is thinner than the first insulation film and disposed between the floating gate and a first channel region. The first channel region is formed in an area of the semiconductor substrate in which the memory cell is to be formed and the second channel region is formed in an area of the semi-conductor substrate in which the transistor is to be formed. The first insulation film is first formed on the first and second channel regions. Then, part of the first insulation film which is formed on the first channel region is removed and the second insulation film is formed to such a thickness as to cause the tunnel effect on the first channel region. By this manufacturing process, the first and second insulation films with different thicknesses can be formed.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a first embodiment of this invention;

FIG. 6 is a cross sectional view taken along the line 6—6 of FIG. 2;

FIG. 7 is a cross sectional view taken along the line 7—7 of FIG. 2;

FIGS. 8A to 8C are cross sectional views showing a sequence of steps of manufacturing the non-volatile semiconductor memory of this invention;

FIGS. 9A to 9C are cross sectional views showing a sequence of manufacturing steps following the manufacturing step of FIG. 8C;

FIG. 13 is a circuit diagram showing a second embodiment of this invention;

FIG. 14 is a plan view showing the circuit pattern of FIG. 13;

FIG. 18 is a circuit diagram showing a fourth embodiment of this invention;

FIG. 19 is a plan view showing the circuit pattern of FIG. 18; and

FIG. 20 is a circuit diagram showing a fifth embodiment of this invention.

DETAILED DESCRIPTION OF THE PREFERRED EMBODIMENTS

Figure 2:
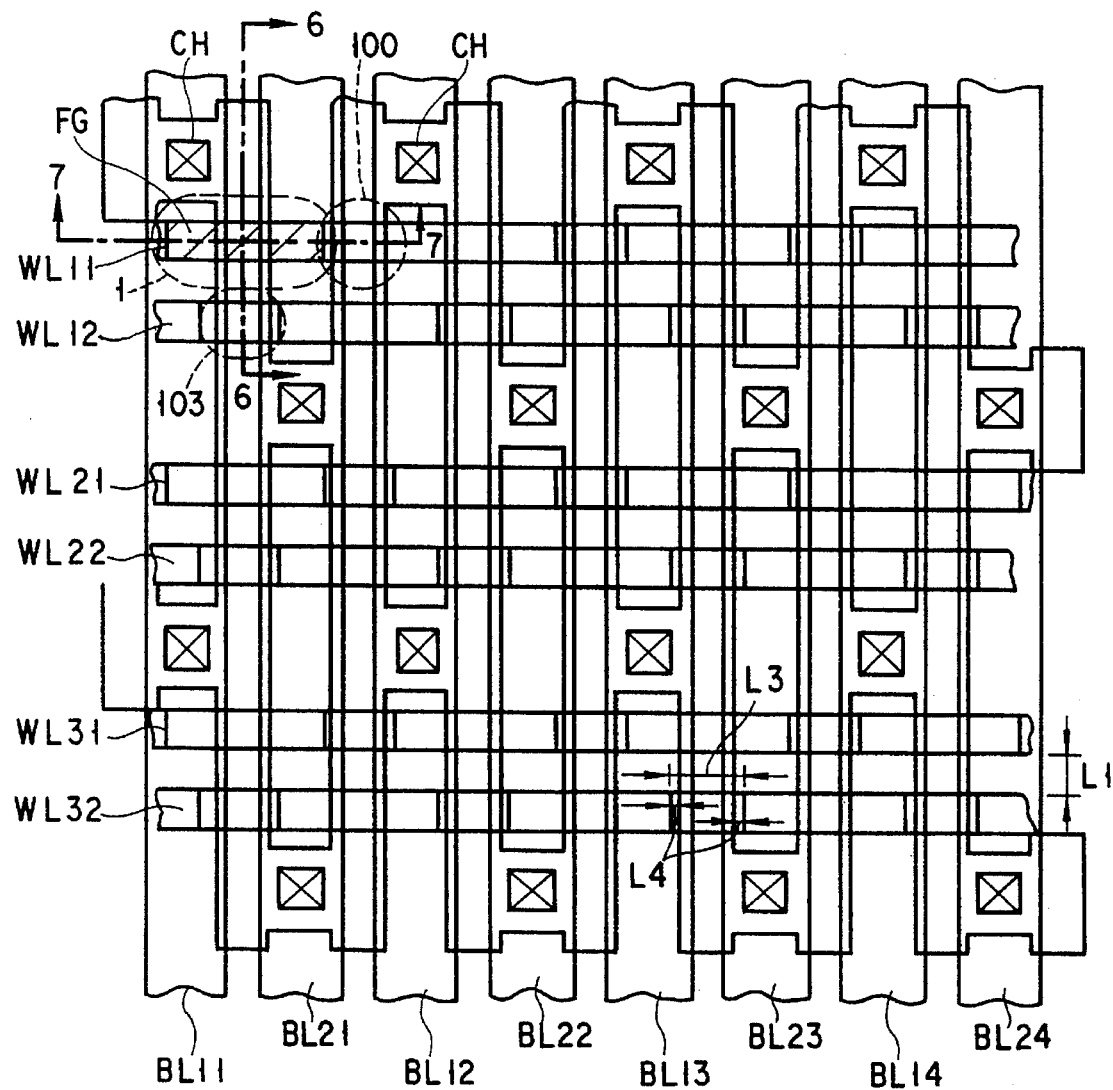
FIG. 2 is a plan view showing the circuit pattern of FIG. 1.

There will now be described embodiments of this invention with reference to the accompanying drawings.

As shown in FIG. 1, each of the memory cells 1 to has a floating gate FG and a control gate CG. Data is programmed into the memory cells 1 to 21 by injecting electrons from the semiconductor substrate into the floating gate through an insulation film disposed between the floating gate and the channel region by the tunnel effect or emitting electrons from the floating gate. Each of the current paths of the memory cells 1 to 21 is serially connected to each of transistors 100 to 120. Blocks BLK which are each constructed by one memory cell and a transistor series-connected to the memory cell are arranged in a matrix form. The memory cells and transistors constructing the blocks are controlled by different row lines. More specifically, the control gates of the memory cells 1, 2, 3 and 4 and the gates of the transistors 100, 101 and 102 are connected to a row line WL11, and the gates of the transistors 103, 104, 105 and 106 and the control gates of the memory cells 5, 6 and 7 are connected to a row line WL12. Further, the control gates of the memory cells 8, 9, 10 and 11 and the gates of the transistors 107, 108 and 109 are connected to a row line WL21, and the gates of the transistors 110, 111, 112 and 113 and the control gates of the memory cells 12, 13 and 14 are connected to a row line WL22. Also, the control gates of the memory cells 15, 16, 17 and 18 and the gates of the transistors 114, 115 and 116 are connected to a row line WL31, and the gates of the transistors 117, 118, 119 and 120 and the control gates of the memory cells 19, 20 and 21 are connected to a row line WL32.

The memory cell and the transistor constructing the block are connected to different column lines, and the column line connected to the memory cell of one of the two adjacent blocks which are controlled by the same row line is connected to the transistor of the other block. That is, the memory cells and the transistors of the blocks are alternately arranged on the same row line and the blocks adjacent in the column direction are connected to the same column line. The column line connected to the memory cell of each block is arranged in position adjacent to the column line connected to the transistor thereof.

Specifically, the current paths of the memory cells 1 and 15 and the current path of the transistor 110 are connected at one end to a column line BL11. The current paths of the memory cells 5, 8 and 19 and the current paths of the transistors 103, 107 and 117 are connected at one end to a column line BL21. The current paths of the memory cells 2, 12 and 16 and the current paths of the transistors 100, 111 and 114 are connected at one end to a column line BL12. The current paths of the memory cells 6, 9 and 20 and the current paths of the transistors 104, 108 and 118 are connected at one end to a column line BL22. The current paths of the memory cells 3, 13 and 17 and the current paths of the transistors 101, 112 and 115 are connected at one end to a column line BL13. The current paths of the memory cells 7, 10 and 21 and the current paths of the transistors 105, 109 and 119 are connected at one end to a column line BL23. The current paths of the memory cells 4, 14 and 18 and the current paths of the transistors 102, 113 and 116 are connected at one end to a column line BL14. The current path of the memory cell 11 and the current paths of the transistors 106 and 120 are connected at one end to a column line BL24. The column lines BL11 to BL24 are commonly connected to a load transistor (not shown) through a column decoder, for example, and the column lines BL11 to BL24 can be charged by the load transistor. The column lines BL11 to BL24 are not necessarily commonly connected to the load transistor through the column decoder, but can be respectively connected to load transistors.

As will be described later, a first voltage generation circuit VG1 generates a positive high voltage Vpp supplied to each of the word lines, a positive voltage Vcc which is lower than the voltage Vpp and is equal to the power supply voltage, for example, a negative voltage −Vcc, and a negative high voltage −Vpp which is lower than the voltage −Vcc. As will be described later, a second voltage generation circuit VG2 generates a positive high voltage Vcc which is equal to the power supply voltage, for example, and supplied to each of the bit lines.

FIG. 2 is a plan view showing the pattern of the circuit shown in FIG. 1 and portions which are the same as those of FIG. 1 are denoted by the same reference numerals. The row lines WL11 to WL32 are formed of polysilicon, for example, and the column lines BL11 to BL24 are formed of aluminum. The column lines and diffusion layers forming the sources and drains of the transistors and the memory cells are connected through contact holes CH.

Figure 3:
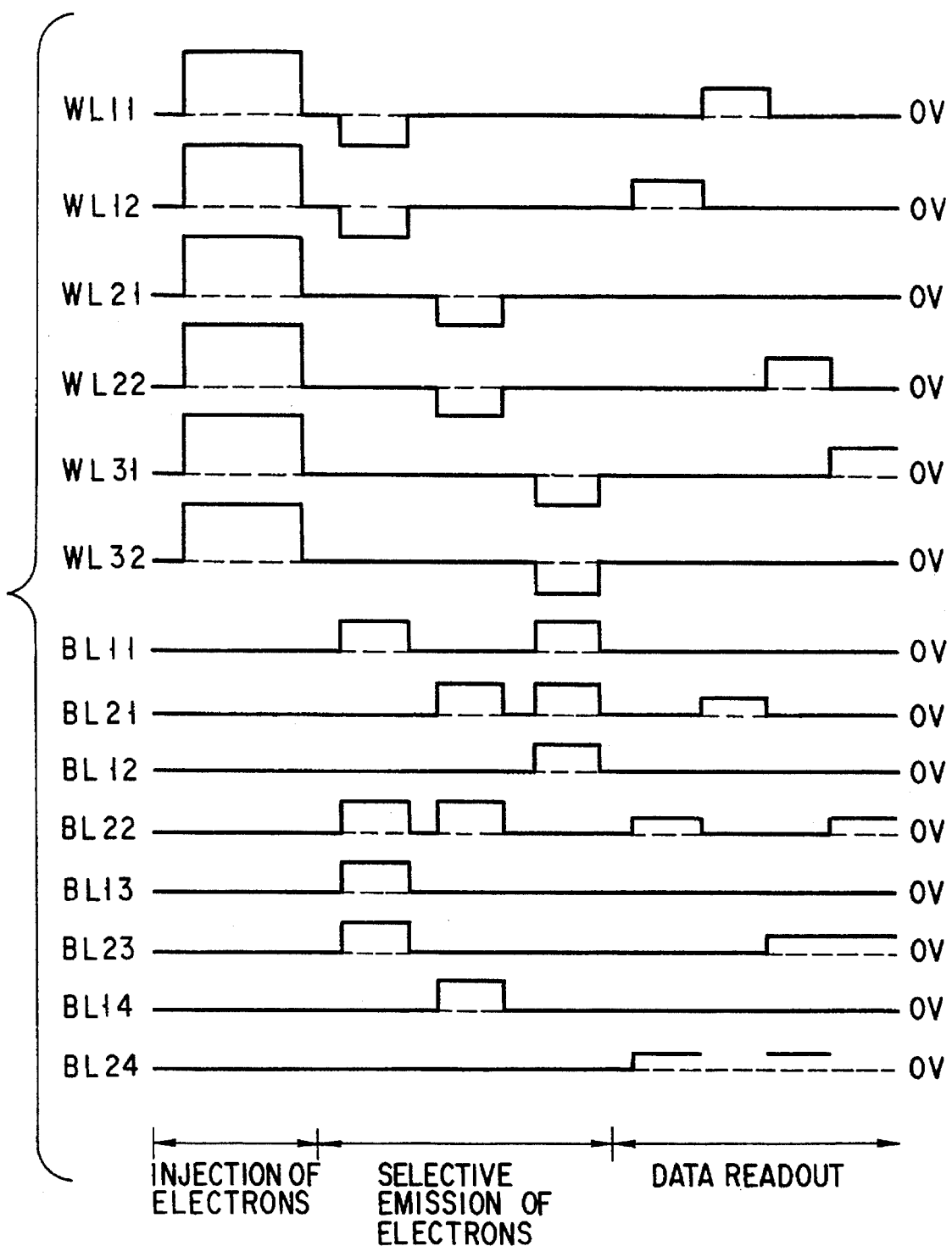
FIG. 3 is a timing chart for illustrating the first programming operation of the circuit shown in FIGS. 1 and 2.

The operation of the circuit with the above construction is explained below. FIG. 3 is a timing chart for illustrating the first programming operation of writing data into the memory cell array shown in FIGS. 1 and 2.

In the first programming operation, first, a high voltage is supplied to all of the row lines WL11 to WL32 and all of the column lines BL11 to BL24 are set to 0 V, for example. Then, an electric field which is strong enough to cause the tunnel effect is created in the gate insulation film between the floating gate and the channel region of each of the memory cells so as to cause electrons to be injected from the channel region into the floating gate. Consequently, the threshold voltage of each of the memory cells is set to a positive voltage. After this, two row lines for one block, for example, WL11 and WL12 are set to a preset negative voltage and the other row lines are set to 0 V, for example. If, in this state, a preset positive voltage is applied to the column line BL11, electrons are emitted from the floating gate of the memory cell 1 shown in FIG. 1 by the tunnel effect to set the threshold voltage of the memory cell to a negative voltage. At this time, electrons are not emitted from the floating gate of the memory cell 5 which is connected to the row line WL12 set at a negative voltage, and the memory cell 5 is kept in the electron-injected state. For this reason, the column line BL21 connected to the memory cell 5 is set to 0 V. Therefore, since an electric field created in the gate insulation film lying under the floating gate of the memory cell 5 is not so strong as to cause the tunnel effect, electrons injected into the floating gate thereof are not emitted. Further, a preset positive voltage is applied to the column line BL11, but the row lines WL21 and WL31 of the memory cells 8 and 15 are set at 0 V. Therefore, since an electric field created in each of the gate insulation films lying under the floating gates of the memory cells 8 and 15 is not so strong as to cause the tunnel effect, electrons are not emitted from the floating gates thereof.

In an example shown in FIG. 3, the potentials of the column lines BL11, BL22, BL13 and BL23 are set to a preset positive potential level when a preset negative voltage is applied to the row lines WL11 and WL12, and the other column lines are set to 0 V. Therefore, electrons are emitted from the floating gates of the memory cells 1, 6, 3 and 7. Thus, electrons are emitted from the floating gate of the memory cell connected to the row line which is set at a preset negative voltage and connected to the column line which is set at a preset positive voltage, and electrons are not emitted from the floating gates of the other memory cells.

The data programming method is not limited to the method of injecting electrons into the floating gates of all of the memory cells and then emitting the electrons. Further, a method of rewriting data of the memory cells of only one row or a method of rewriting data for each memory cell can be used. For example, only the row line WL11 is set to a high voltage to inject electrons into the floating gates of the memory cells 1, 2, 3 and 4. After this, only the row line WL11 is set to a preset negative voltage and the column lines BL11, BL12, BL13 and BL14 are set to 0 V or a preset positive voltage according to data to be written. By this operation, data of the memory cells of one row relating to the row line WL11 can be rewritten.

In a case wherein data is rewritten for each memory cell, the following operation is performed. For example, when data of the memory cell 9 is rewritten, the row line WL21 is set to a high voltage, the other row lines are set to 0 V, the column line BL22 is set to 0 V, and the other column lines BL21, BL23 and BL24 are set to a preset positive voltage. Electrons are injected into only the memory cell 9. On the other hand, when electrons are emitted from only the memory cell 9, the row line WL21 is set to a preset negative voltage, the other row lines are set to 0 V, the column line BL22 is set to a preset positive voltage, and the other column lines are set to 0 V. Then, electrons can be emitted from only the memory cell 9. Thus, data of a desired number of memory cells can be rewritten by changing a combination of voltages applied to the row lines and the column lines.

Next, the operation of reading data from a memory cell which is programmed as described above is explained. When data is read from a memory cell, the column lines BL11, BL12, BL13 and BL14 are set to 0 V. A row line which is one of the two row lines associated with the series-connected memory cell and transistor constructing the block and which is connected to the memory cell is set to 0 V and the other row line connected to the transistor is set to a preset positive voltage. For example, when the power supply voltage is 5 V, the row line connected to the transistor is set to 5 V. When data is read out from the memory cell connected to the row line WL11, the row line WL11 is set to 0 V and the row line WL12 is set to 5 V, for example. At this time, the other row lines are set to 0 V. Since the row lines other than the row line WL12 are set to 0 V, the transistors connected to the row lines other than the row line WL12 are made non-conductive and a current does not flows through a memory cell series-connected with the above transistor. Since electrons are emitted from the floating gate of the memory cell 1 and the threshold voltage thereof is negative, the memory cell 1 is made conductive even if the row line WL11 is set at 0 V. Therefore, the voltage of the column line BL21 is discharged to the voltage level of the column line BL11 which is set at 0 V through the transistor 103 whose gate is set at 5 V and which is set in the conductive state. Data can be read out by detecting the potential of the column line BL21 by use of a sense amplifier or the like.

At this time, the memory cell 5 whose gate is set at 5 V is set in the conductive state. However, since the gate of the transistor 100 is set at 0 V, a current path is not constructed by the transistors 100 and no current flows through the memory cell 5 and the transistor 100.

Electrons are injected into the floating gate of the memory cell 2 and the threshold voltage thereof is positive. Since the row line WL11 is set at 0 V, the memory cell 2 is set in a non-conductive state. Therefore, even if the transistor 104 whose gate is set at 5 V is made conductive, no current flows through the transistor 104 and the memory cell 2. For this reason, the column line BL22 is charged through a load transistor (not shown), the charged state of the column line BL22 is detected by a sense amplifier (not shown), and thus data is read from the memory cell 2.

When data is read from the memory cell connected to the row line WL12, the row line WL12 is set to 0 V and the row line WL11 is set to 5 V, for example. At this time, the other row lines are set to 0 V. Thus, data can be read out from a desired memory cell in the same manner as described above.

The example shown in FIG. 3 is a case wherein data is read out from all of the memory cells connected to one row line through corresponding column lines. In this case, the column lines BL21, BL22, BL23 and BL24 are respectively connected to the load transistors and the column lines BL21, BL22, BL23 and BL24 are charged through the respective transistors. However, this is not limitative and, for example, it is possible to select one of the column lines by use of a column decoder (not shown) and read out data from a memory cell connected to the selected column line.

Further, when data is read out from the memory cell 1, the column line BL11 is set to 0 V and then data is read out from the memory cell 1 by detecting whether the column line BL21 is in the charged state or discharged state. When data is read out from the memory cell 5, the column line BL21 is set to 0 V and then data is read out by detecting whether the column line BL12 is in the charged state or discharged state, and thus the column line through which data is detected can be sequentially changed.

According to the above embodiment, at the data programming, electrons are injected into the floating gate and the electrons are selectively emitted to set the threshold voltage of the memory cell to a negative or positive value. Further, since data is read out with the selected row line set at 0 V, it is only necessary to set the threshold voltage of the memory cell in which electrons have been injected higher than 0 V and set the threshold voltage of the memory cell in which electrons have been emitted from the floating gate to a negative value. Therefore, unlike the conventional case, it is not necessary to check the emission state of electrons in the memory cell and injection or emission of electrons may be set in the saturated state. That is, since it is only required to emit or inject electrons for a preset period of time, the complicated control operation is not necessary unlike the conventional case. Therefore, the control circuit can be made significantly simple in construction in comparison with the conventional case.

Conventionally, when electrons are emitted from the floating gate of the memory cell, it is necessary to read out data from all of the memory cells in order to check the amount of emitted electrons and it becomes necessary to provide a circuit for generating addresses of the memory cells. However, in the circuit used in this embodiment, it is not necessary to check the amount of emitted electrons of the memory cell and therefore a circuit for generating addresses is not necessary.

Further, since the gate voltage of the selected memory cell is 0 V, a difference between the threshold voltage of the memory cell and the gate voltage is constant irrespective of whether the power supply voltage is 5 V or 3 V. Therefore, even if the power supply voltage is lowered, deterioration in the readout speed can be suppressed.

Next, the second programming operation for writing data into the memory cell array shown in FIGS. 1 and 2 is explained with reference to FIG. 4.

Figure 4:
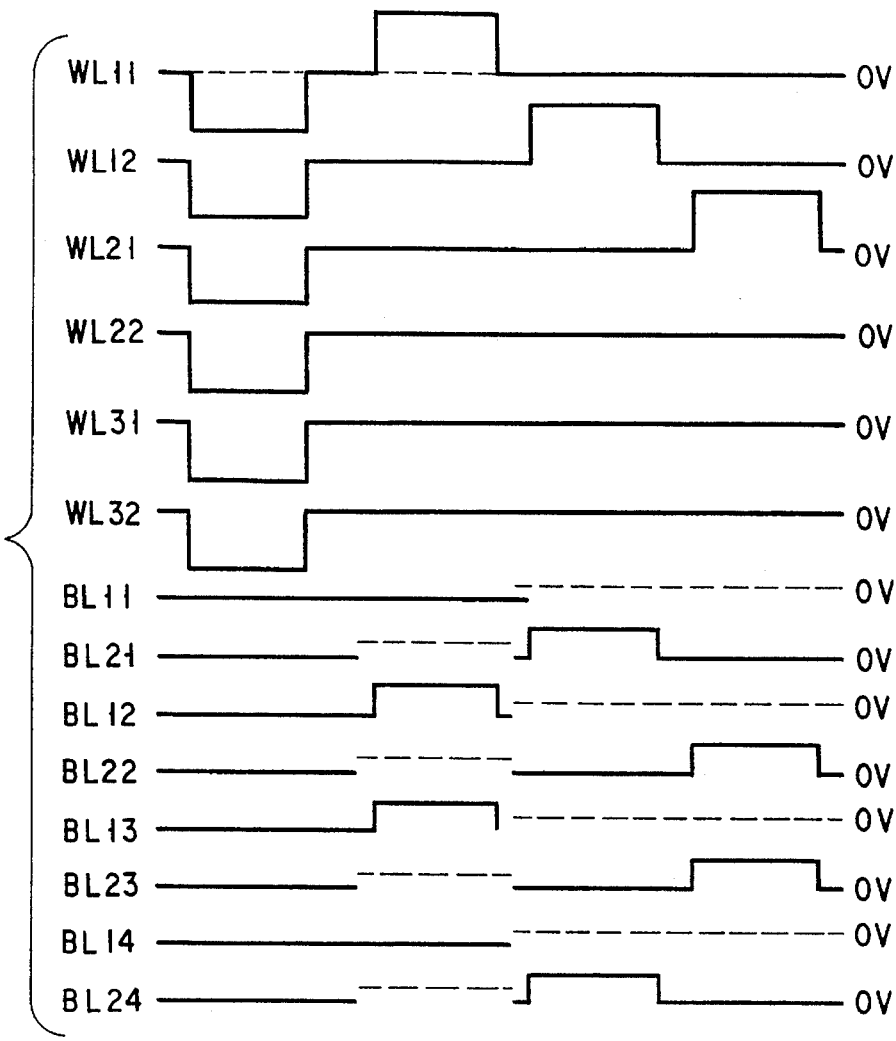
FIG. 4 is a timing chart for illustrating the second programming operation of the circuit shown in FIGS. 1 and 2.

In the second programming method shown in FIG. 4, a preset negative voltage is first supplied to all of the row lines and all of the column lines are set to 0 V, for example. An electric field generated in the gate insulation film between the floating gate and the channel region of each of the memory cells is made strong enough to cause the tunnel effect so as to emit electrons from the floating gate of all of the memory cells and set the threshold voltage of each of the memory cells to a negative voltage. In order to set the threshold voltage of the memory cell to a negative voltage, a relative potential difference between the semiconductor substrate in which the memory cell is formed and the control gate of the memory cell may be set to a potential which can cause electrons to be emitted from the floating gate. For this purpose, for example, the row line may be set to 0 V and the potential of the semiconductor substrate in which the memory cell is formed may be set to a preset positive potential.

After this, for example, one row line WL11 is set to a preset positive potential and the other row lines are set to 0 V, for example. If, in this state, the column line BL11 is set to 0 V, electrons are injected into the floating gate of the memory cell 1 shown in FIG. 1 and the threshold voltage of the memory cell is set to a positive value. In the memory cell 2, in order to prevent electrons from being injected into the floating gate thereof and keep the electron-emitted state, the column line BL12 connected to the memory cell 2 is set to a preset positive voltage. Therefore, an electric field generated in the insulation film lying under the floating gate is not so strong as to cause the tunnel effect and no electrons are injected into the floating gate of the memory cell 2.

At this time, a preset positive voltage is applied to the column line BL12, but the row lines connected to the other memory cells 12 and 16 are set to 0 V. Therefore, an electric field generated in the insulation films lying under the floating gates of the memory cells 12 and 16 is not as strong as to cause the tunnel effect and no electrons are emitted from the floating gate.

In the example shown in FIG. 4, when a preset positive voltage is applied to the row line WL11, the column lines BL12, BL13 are set at a preset positive voltage and the other column lines BL11, BL14 are set at 0 V. Therefore, electrons are injected into the floating gates of the memory cells 1, 4 and the floating gates of the memory cells 2, 3 are kept in the electron-emitted state. Further, since the column lines BL21, BL22, BL23 and BL24 are set in the electrically floating state, the states of the memory cells connected to the above column lines are kept unchanged. Thus, data is programmed by sequentially setting the row lines to a high voltage.

As described in the explanation for the first programming operation, the operation of rewriting data of the memory cells of one row or data of the memory cells of a desired number of rows can be effected by selectively setting a combination of the voltages of the row lines and the column lines. For example, only the row line WL11 is set to a negative voltage to emit electrons from the floating gates of the memory cells 1, 2, 3 and 4, and after this, the row line WL11 is set to a preset positive voltage, and the column lines BL11, BL12, BL13 and BL14 are set to 0 V or a preset positive voltage according to data to be written. By this operation, data of the memory cells of one row relating to the row line WL11 can be rewritten.

Figure 5:
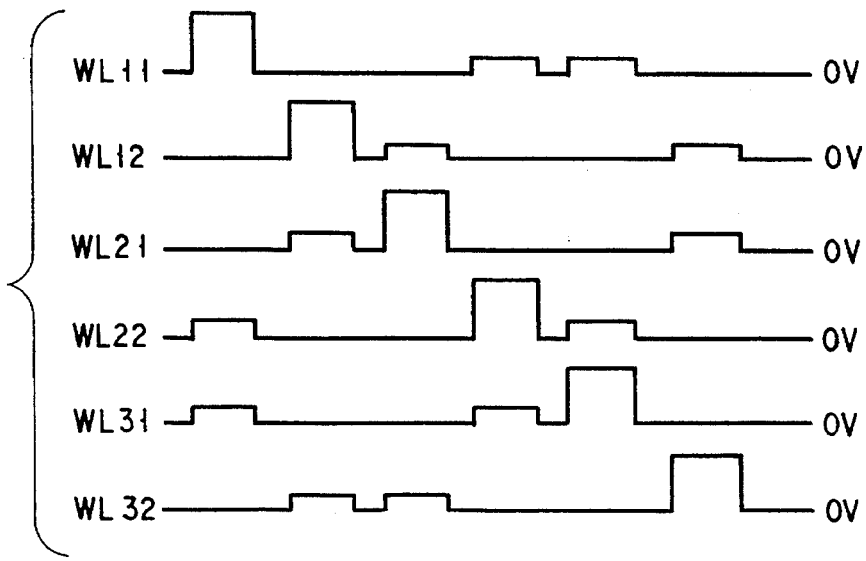
FIG. 5 is a timing chart for illustrating the third programming operation of the circuit shown in FIGS. 1 and 2.
Figure 10:
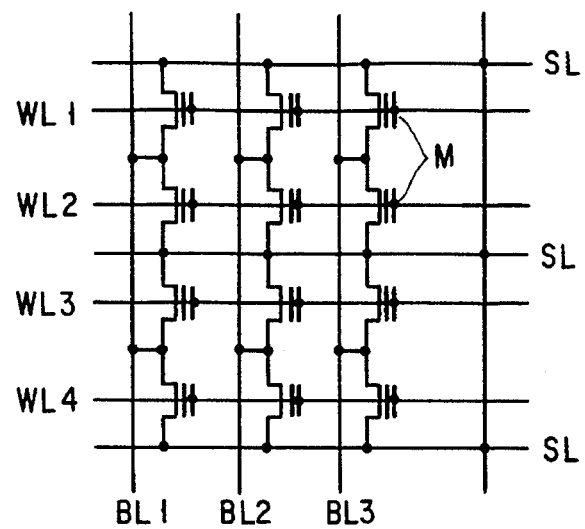
FIG. 10 is a circuit diagram showing an example of the conventional non-volatile semiconductor memory.

FIG. 5 is a diagram for illustrating the third programming operation obtained by improving the second programming operation shown in FIG. 4. In FIG. 4, the column line connected to a memory cell in which it is not desired to inject electrons into the floating gate thereof is set to a preset positive voltage, and if the voltage is excessively high, there occurs a possibility that electrons are erroneously emitted from the floating gate of the memory cell whose control gate is set at 0 V to the column line which is applied with a preset voltage. The third programming operation shown in FIG. 5 is obtained by preventing the above erroneous operation.

For example, when the row line WL11 is set to a high voltage and data is programmed into a memory cell connected to the row line WL11, the row lines WL2, WL31 connected to memory cells which are connected to column lines to which a preset positive voltage may be applied are set to a preset positive voltage which is lower than the voltage of the row line WL11. By the above voltage setting, the potential of the floating gate is raised by the capacitive coupling between the control gate and the floating gate. As a result, the potential difference between the column line and the floating gate becomes small so as to prevent electrons from being emitted from the floating gate to the column line.

Figure 11:
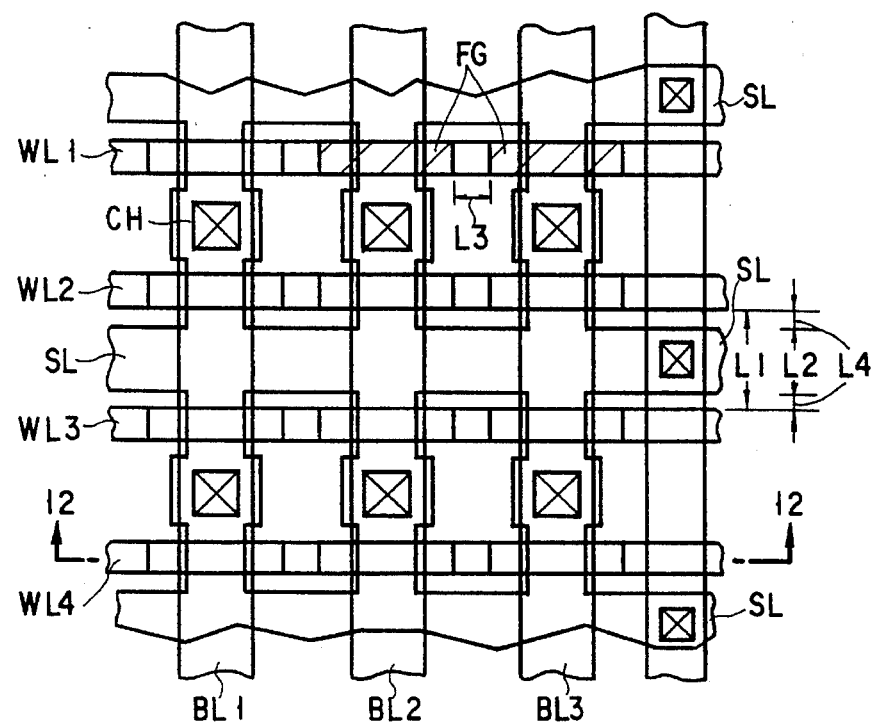
FIG. 11 is a plan view showing the circuit pattern of FIG. 10.
Figure 12:
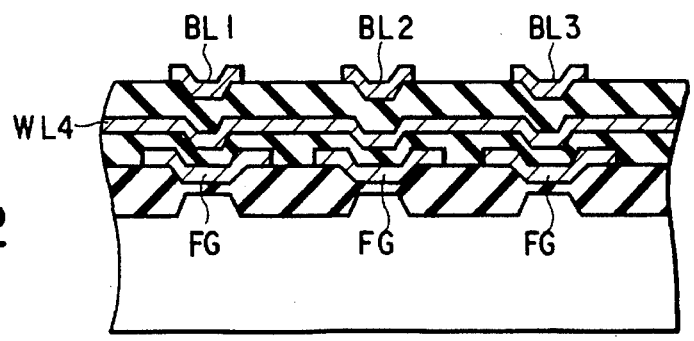
FIG. 12 is a cross sectional view taken along the line 12—12 of FIG. 11.

Next, the pattern area of the non-volatile semiconductor memory of this invention shown in FIG. 2 and the conventional non-volatile semiconductor memory shown in FIG. 11 are explained. As is clearly understood by comparing the pattern planes with each other, there are one column line and one contact hole CH to every two memory cells in both of the cases of FIGS. 2 and 11. Therefore, the number of contact holes CH is the same in the conventional case and this invention.

The distance L1 in the column direction in FIG. 2 is defined by the space between polysilicon wirings forming the row lines. On the other hand, the distance L1 in the conventional case shown in FIG. 11 is defined by the mask alignment margin L4 between the diffusion layers for forming source lines SL and the row lines and the width L2 of the source line SL. In the conventional pattern, since a large current flows when electrons are injected into the floating gate of the memory cell, a current flows through the diffusion layer of the source line SL. Therefore, it is necessary to determine the width of the diffusion layer SL to a preset value in order to reduce the voltage drop by the resistance of the diffusion layer SL. Therefore, the distance L1 becomes longer in the conventional pattern. However, the size of the pattern in the column direction becomes smaller in this invention.

If it is assumed that the length of the polysilicon layer used for forming the floating gate FG in the row direction is the same in the conventional case and this invention, only the distance L3 between the floating gates is different. The length of the conventional pattern shown in FIG. 11 is defined by the space between the polysilicon layers used for forming the floating gates. However, in the case of this invention, the distance L3 is defined by the channel width of the transistor series-connected with the memory cell and the mask alignment margin L4 between the channel region and the floating gate. Consequently, the distance L3 in the row direction becomes longer in this invention.

In general, the channel width of the memory cell is determined to the minimum width permitted in the design rule in order to reduce the chip size. Therefore, the width of the transistor shown in FIG. 2 is designed to be minimum. For example, when the space between the floating gates shown in FIG. 11 and the channel width shown in FIG. 2 are set equal to each other, the pattern shown in FIG. 2 becomes larger than the pattern shown in FIG. 11 by an amount corresponding to the mask alignment margin L4. However, in FIG. 11, it is necessary to set the width L2 of the diffusion layer to a large value in order to reduce the resistance of the diffusion layer used as the source. Therefore, the length corresponding to the sum of the width L2 of the diffusion layer and the mask alignment margin L4 of the source becomes larger. As a result, substantially no difference occurs between the sizes of the memory cells in the conventional case and this invention.

Conventionally, when a memory cell is selected, the row line is set to a preset positive voltage. Therefore, if the floating gate of the memory cell is deviated from its correct position owing to an error in the mask alignment and part of the channel region is exposed, a portion including the exposed part acts as a transistor in which the exposed part is controlled by the control gate. As a result, when the memory cell is selected, the transistor of a part of the memory cell is always set in the conductive state, thereby causing an erroneous operation. Therefore, in the conventional case, it is necessary to make a portion of the floating gate which lies on the field region large so as to prevent the channel region from being exposed even when the floating gate is deviated from its correct position.

In contrast, in this invention, the row line is set to 0 V when the memory cell is selected. That is, at the data reading, the control gate is set at 0 V. Therefore, even if the floating gate is deviated from its correct position and a transistor in which part of the channel region is controlled by the control gate is formed, the transistor will not be made conductive at the data reading and no erroneous operation occurs. Thus, in this invention, since part of the floating gate lying on the field region can be made smaller in comparison with the conventional case, the area of the memory cell can be reduced in comparison with the conventional case.

Next, a method of manufacturing the non-volatile semiconductor memory according to this invention is explained.

FIG. 6 is a cross sectional view taken along the line 6—6 of FIG. 2, and FIG. 7 is a cross sectional view taken along the line 7—7 of FIG. 2. As shown in FIGS. 6 and 7, a gate insulation film GI1 disposed between the floating gate FG of the memory cell 1 and the channel region CH1 must be made thin enough to cause the tunnel effect. Further, a gate insulation film GI2 of transistors 100 and 103 series-connected with the memory cell 1 must be made thicker than that of the memory cell 1. The thickness of the gate insulation film GI2 is determined so as not to be destroyed by an electric field created in the gate insulation film by a high voltage applied to inject or emit electrons into or from the floating gate FG of the memory cell 1.

The two types of gate insulation films with different thicknesses are formed as follows.

As shown in FIG. 8A, field oxide films 51, 52 and 53 are formed with a preset space set therebetween on the surface area of a semiconductor substrate 50. The memory cell 1 is formed between the field oxide films 51 and 52 in the later step and the transistor 100 is formed between the field oxide films 52 and 53 in the later step. The channel regions CH1 and CH2 are respectively formed between the field oxide films 51 and 52 and between the field oxide films 52 and 53. Gate insulation films 54 and 55 are formed on the surface of the channel regions CH1 and CH2. After this, the gate insulation film in an area in which the memory cell is formed is removed.

That is, as shown in FIG. 8B, the surface of the semiconductor substrate 50 except the area in which the memory cell 1 is formed is covered with a photoresist film 56. The resultant structure is etched by the RIE (Reactive Ion Etching) process, for example, with the photoresist film 56 used as a mask to remove the gate insulation film 54 as shown in FIG. 8C. Next, as shown in FIG. 9A, after the photoresist film 56 is removed, the surface of the semiconductor substrate 50 is subjected to the thermal oxidation process to form a gate insulation film 57 which is thin enough to cause the tunnel effect. At this time, the surface of the gate insulation film 55 is also oxidized and the gate insulation film 55 becomes thicker than the gate insulation film 57.

After this, as shown in FIG. 9B, the floating gate FG is formed of polysilicon on the gate insulation film 57. At this time, even if the floating gate FG covers part of the channel region CH2 of the transistor 100 owing to the mask alignment error, the gate insulation film 55 of the transistor 100 is already formed. Therefore, the transistor will not be destroyed by an electric field created between the floating gate FG and the channel region CH2. Further, even if part of the gate insulation film 55 is covered with the floating gate FG, the tunnel effect will not be caused in the partial area. In the partial area, even if the floating gate FG from which electrons are emitted overlaps the gate insulation film 55 and a current flows, the current is extremely small in comparison with a current flowing in the memory cell since the gate insulation film 55 is thick, thereby preventing the transistor from being erroneously operated. Therefore, in this invention, the mask alignment margin L4 shown in FIG. 2 can be set to a minimum value.

Next, as shown in FIG. 9C, an insulation film 58 is formed on the entire surface of the resultant structure by the thermal oxidation and the control gate CG of the memory cell and a row line 59 (WL11) used as the gate of the transistor are formed on the insulation film 58. After this, an insulation film (not shown) is formed on the entire surface and a column line is formed on the insulation film.

According to the above manufacturing method, when the gate insulation film previously formed in the memory cell forming area is removed and a thin gate insulation film is formed in this area, the gate insulation film previously formed in the transistor forming area is thermally oxidized. Therefore, the thin gate insulation film and the thick gate insulation film can be simultaneously formed.

FIG. 13 shows a second embodiment of the invention. In FIG. 13, elements similar to those in FIG. 1 are denoted by corresponding reference numerals, and explanations will be given only of different elements. The second embodiment differs from the first embodiment in the manner of connecting memory cells to column lines.

Specifically, the current path between the memory cell 5 and the transistor 107 is connected to the bit line BL22, the current path between the memory cell 6 and the transistor 108 to the bit line BL23, and the current path between the memory cell 7 and the transistor 109 to the bit line BL24. Further, the current path of the memory cell 19 is connected to the bit line BL22, the current path of a memory cell M20 to the bit line BL23, and the current path of a memory cell M21 to the bit line BL24.

FIG. 14 is a plan view of the circuit pattern shown in FIG. 13. In FIG. 14, elements similar to those in FIG. 13 are denoted by corresponding reference numerals. The circuit employed in the second embodiment operates in the same manner as that of the first embodiment.

The second embodiment can provide the same advantage as the first embodiment, and further provide the advantage that the number of contact holes formed in the column lines BL12, BL13 and BL14 can be reduced.

Figure 15:
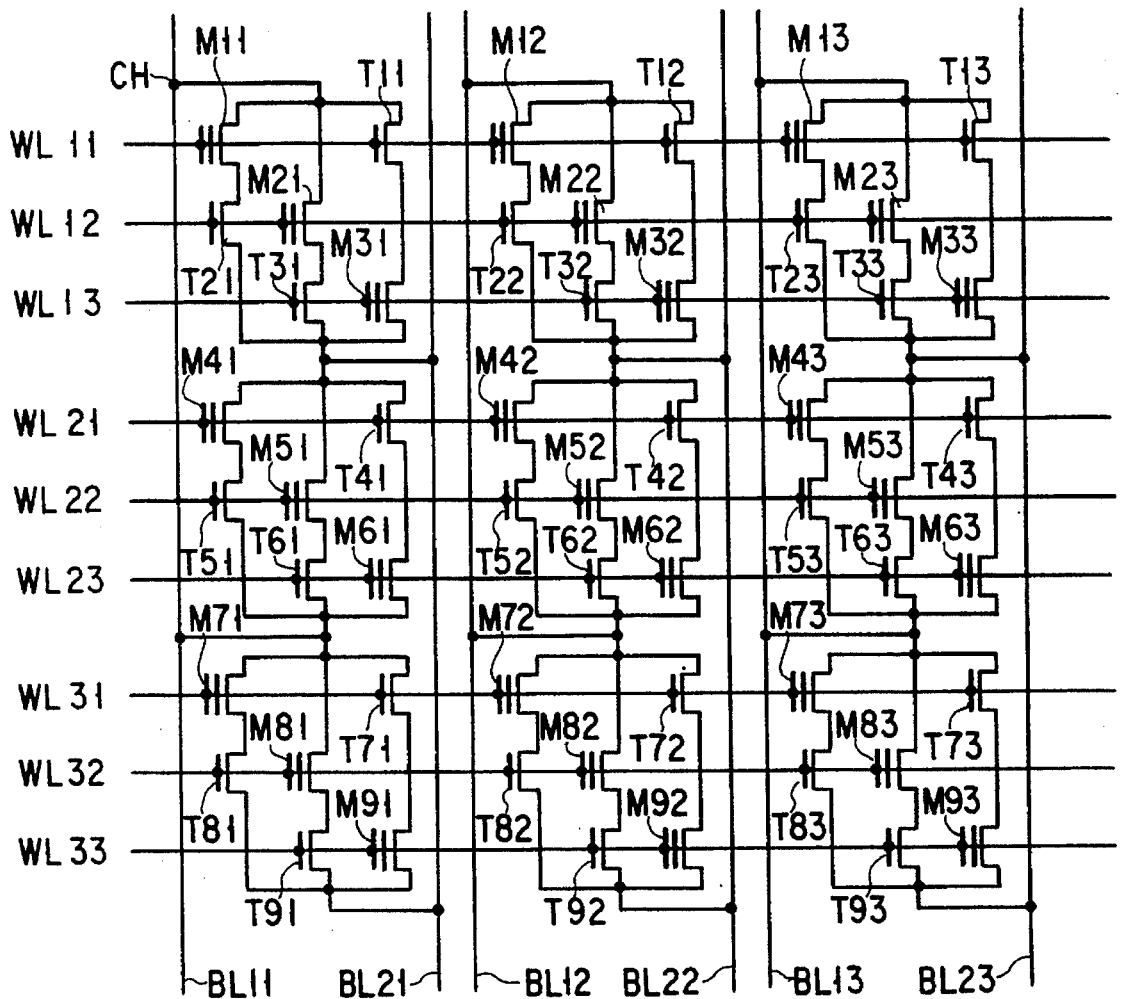
FIG. 15 is a circuit diagram showing a third embodiment of this invention.

FIG. 15 shows a third embodiment of the invention.

The control gates of memory cells M11, M12 and M13 and the gates of transistors T11, T12 and T13 are connected to the row line WL11, the control gates of memory cells M21, M22 and M23 and the gates of transistors T21, T22 and T23 to the row line WL12, and the control gates of memory cells M31, M32 and M33 and the gates of transistors T31, T32 and T33 are connected to the row line WL13. One end of the current path of each of the memory cells M11 and M21 and the transistor T11 is connected to the column line BL11, while the other end of the current path of each of the memory cells M11 and M21 and the transistor T11 is connected to one end of the current path of a corresponding one of the transistors T21 and T31 and the memory cell M31. The other end of the current path of each of the transistors T21 and T31 and the memory cell M31 is connected to the column line BL21. One end of the current path of each of the memory cells M12 and M22 and the transistor T12 is connected to the column line BL12. The other end of the current path of each of the memory cells M12 and M22 and the transistor T12 is connected to one end of the current path of a corresponding one of the transistors T22 and T32 and the memory cell M32. The other end of the current path of each of the transistors T22 and T32 and the memory cell M32 are connected to the column line BL22. One end of the current path of each of the memory cells M13 and M23 and the transistor T13 is connected to the column line BL13, and the other end of the current path of each of the memory cells M13 and M23 and the transistor T13 is connected to one end of the current path of a corresponding one of the transistors T23 and T33 and the memory cell M33. The other end of the current path of the transistors T23 and T33 and the memory cell M33 is connected to the column line BL23.

The control gates of memory cells M41, M42 and M43 and the gates of transistors T41, T42 and T43 are connected to the row line WL21, the control gates of memory cells M51, M52 and M53 and the gates of transistors T51, T52 and T53 to the row line WL22, and the control gates of memory cells M61, M62 and M63 and the gates of transistors T61, T62 and T63 are connected to the row line WL23. One end of the current path of each of the memory cells M41 and M51 and the transistor T41 is connected to the column line BL21, while the other end of the current path of each of the memory cells M41 and M51 and the transistor T41 is connected to one end of the current path of a corresponding one of the transistors T51 and T61 and the memory cell M61. The other end of the current path of each of the transistors T51 and T61 and the memory cell M61 is connected to the column line BL11. One end of the current path of each of the memory cells M42 and M52 and the transistor T42 is connected to the column line BL22. The other end of the current path of each of the memory cells M42 and M52 and the transistor T42 is connected to one end of the current path of a corresponding one of the transistors T52 and T62 and the memory cell M62. The other end of the current path of each of the transistors T52 and T62 and the memory cell M62 are connected to the column line BL12. One end of the current path of each of the memory cells M43 and M53 and the transistor T43 is connected to the column line BL23, and the other end of the current path of each of the memory cells M43 and M53 and the transistor T43 is connected to one end of the current path of a corresponding one of the transistors T53 and T63 and the memory cell M63. The other end of the current path of each of the transistors T53 and T63 and the memory cell M63 is connected to the column line BL13.

Further, the control gates of memory cells M71, M72 and M73 and the gates of transistors T71, T72 and T73 are connected to the row line WL31, the control gates of memory cells M81, M82 and M83 and the gates of transistors T81, T82 and T83 to the row line WL32, and the control gates of memory cells M91, M92 and M93 and the gates of transistors T91, T92 and T93 are connected to the row line WL33. One end of the current path of each of the memory cells M71 and M81 and the transistor T71 is connected to the column line BL11, while the other end of the current path of each of the memory cells M71 and M81 and the transistor T71 is connected to one end of the current path of a corresponding one of the transistors T81 and T91 and the memory cell M91. The other end of the current path of each of the transistors T81 and T91 and the memory cell M91 is connected to the column line BL21. One end of the current path of each of the memory cells M72 and M82 and the transistor T72 is connected to the column line BL12. The other end of the current path of each of the memory cells M72 and M82 and the transistor T72 is connected to one end of the current path of a corresponding one of the transistors T82 and T92 and the memory cell M92. The other end of the current path of each of the transistors T82 and T92 and the memory cell M92 are connected to the column line BL22. One end of the current path of each of the memory cells M73 and M83 and the transistor T73 is connected to the column line BL13, and the other end of the current path of each of the memory cells M73 and M83 and the transistor T73 is connected to one end of the current path of a corresponding one of the transistors T83 and T93 and the memory cell M93. The other end of the current path of each of the transistors T83 and T93 and the memory cell M93 is connected to the column line BL23.

Figure 16:
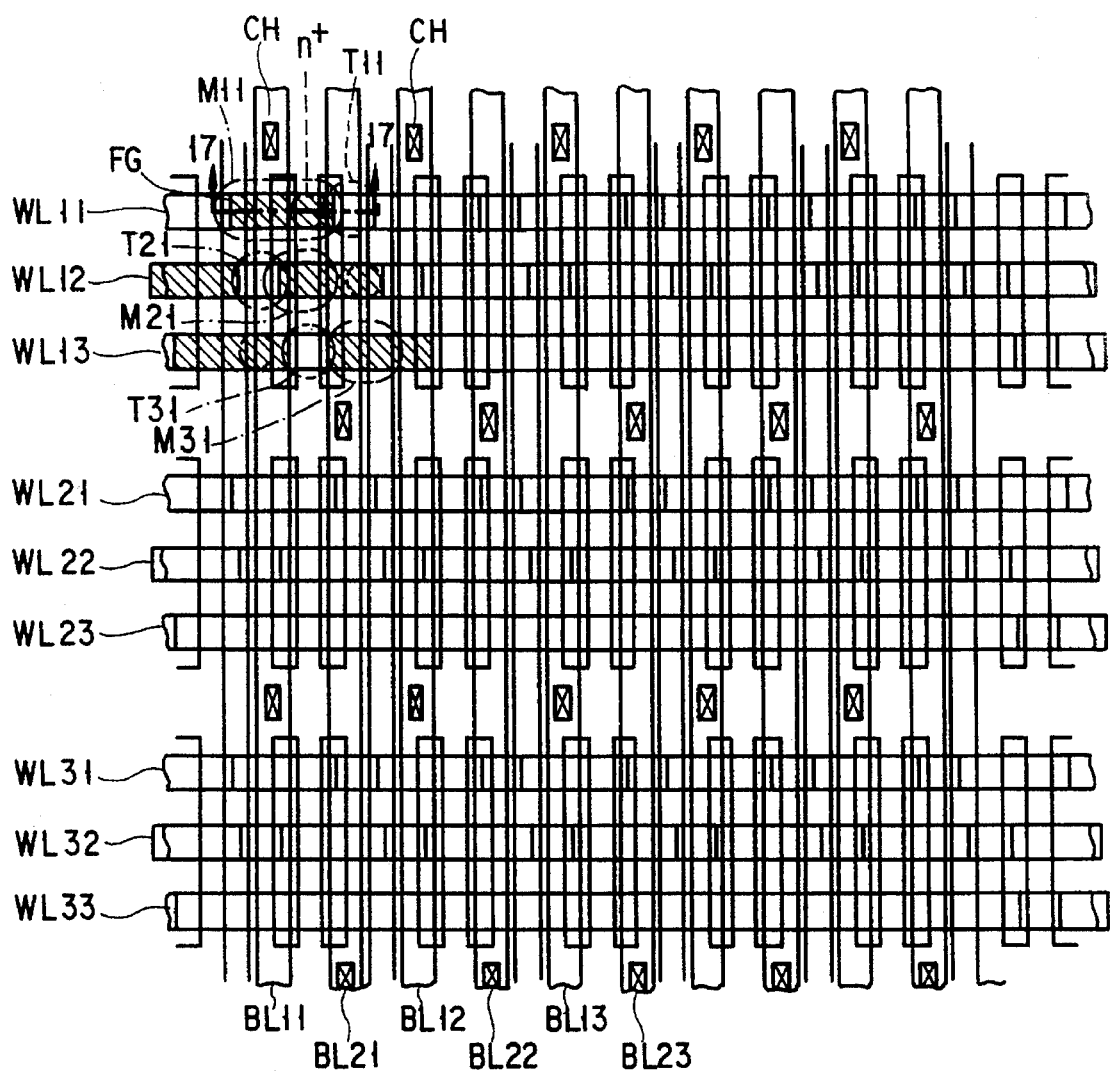
FIG. 16 is a plan view showing the circuit pattern of FIG. 15.
Figure 17:
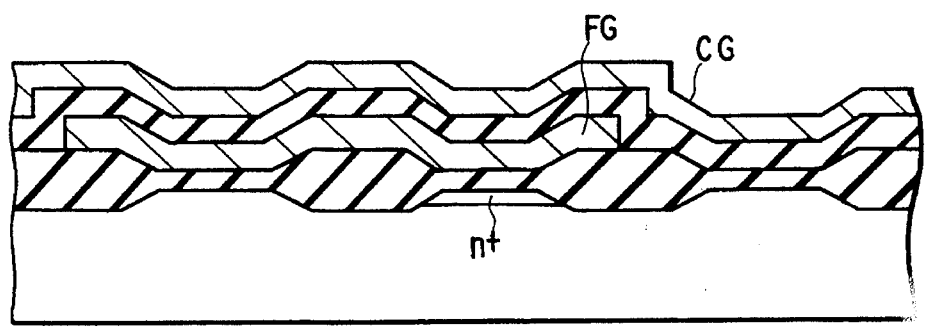
FIG. 17 is a cross sectional view taken along the line 17—17 of FIG. 16.

FIG. 16 is a plan view of the circuit pattern of FIG. 15. In FIG. 16, elements similar to those in FIG. 15 are denoted by corresponding reference numerals. The row lines WL11–WL33 are made of polysilicon, and the column lines BL11–BL24 of aluminum. The diffusion layer which constitutes each of the source and drain of a transistor or a memory cell is connected to a corresponding column line by means of a contact hole CH. The floating gate of each memory cell extends along a corresponding row line, and the diffusion layer $n^+$ of a memory cell or a transistor connected to an adjacent row line is located under the extended floating gate. For example, the diffusion layer of the memory cell M21 is located under the floating gate of the memory cell M11. FIG. 17 is a cross sectional view, showing part of the FIG. 16 structure. As is shown in FIG. 17, a diffusion layer $n^+$ is located under the floating gate FG.

The operation of the above-described non-volatile semiconductor memory device is substantially similar to that of the FIG. 1 circuit. In the programming operation, first, a high voltage is supplied to all of the row lines WL11 to WL33 and all of the column lines BL11 to BL23 are set to 0 V, for example. Then, an electric field which is strong enough to cause the tunnel effect is created in the gate insulation film between the floating gate and the channel region of each of the memory cells so as to cause electrons to be injected from the channel region into the floating gate. Therefore, the threshold voltage of each of the memory cells is set to a positive voltage. After this, one row line, for example, WL11 is set to a preset negative voltage and the other row lines are set to 0 V, for example. If, in this state, a preset positive voltage is applied to the column line BL11, electrons are emitted from the floating gate of the memory cell M11 by the tunnel effect to set the threshold voltage of the memory cell to a negative voltage. At this time, the column lines BL12 and BL13 connected to the memory cells M12 and M13 are set to 0 V. Since the electric field created in the gate insulation film under the floating gates of the memory cells M12 and M13, which is connected to the row line WL12 set at a negative value, is not strong enough to cause the tunnel effect, no electrons are emitted from the floating gates of the memory cells M12 and M13 and the memory cell is kept in the electron-injected state. Further, although the column line BL11 is set to a preset positive value, the row lines WL31 and WL32 connected to the memory cells M71 and M81 are set to 0 V. Therefore, since an electric field created in the gate insulation film lying under the floating gate of the memory cell is not so strong as to cause the tunnel effect, electrons injected into the floating gate thereof are not emitted.

Further, to program the memory cell M21, the row line WL12 is set to a preset negative voltage, and the other row lines are set to 0 V, for example. At this time, a preset positive voltage is applied to the column line BL11. Moreover, to program the memory cell M31, the row line WL13 is set to a preset negative voltage and the other row lines are set to 0 V, for example. At this time, a preset positive voltage is applied to the column line BL21.

The manner of reading data from a memory cell which is programmed as described above will now be explained. When data is read out, every other column line is set to 0 V. In the case of this embodiment, the column lines BL11, BL12 and BL13 are set to 0 V. When data is read out, a row line which is one of the two row lines associated with the series-connected memory cell and transistor and which is connected to the memory cell is set to 0 V and the row line connected to the transistor is set to a preset positive voltage. For example, when the power supply voltage is 5 V, the row line connected to the transistor is set to 5 V. When data is read out of the memory cell connected to the row line WL11, the row line WL11 is set to 0 V and the row line WL12 is set to 5 V, for example. At this time, the other row lines are set to 0 V. Since the row lines other than the row line WL12 are set to 0 V, the transistors connected to the row lines other than the row line WL12 are made non-conductive and a current path which passes through a memory cell series-connected with the above transistor cannot be created. Since electrons are emitted from the floating gate of the memory cell M11 and the threshold voltage thereof is negative, the memory cell M11 is made conductive even if the row line WL11 is set at 0 V. Therefore, the voltage of the column line BL21 is discharged to the voltage level of the column line BL11 which is set at 0 V through the memory cell M11 and the transistor T21 whose gate is set at 5 V and which is set in the conductive state. Data can be read out by detecting the potential of the column line BL11 with use of a sense amplifier or the like.

At this time, the memory cell M21 whose gate is set at 5 V is set in the conductive state. However, since the gate of the transistor T31 is set at 0 V, a current path is not formed by the memory cell M21 and the transistor T31 and no current flows through the memory cell M21 and the transistor T31.

Electrons are injected into the floating gate of the memory cell M12 and the threshold voltage thereof is positive. Since the row line WL11 is set at 0 V, the memory cell M12 is set in the non-conductive state. Therefore, even if the transistor T22 whose gate is set at 5 V is made conductive, no current flows through the transistor T22 and the memory cell M12. For this reason, the column line BL22 is charged through a load transistor (not shown), and the charged state is detected by a sense amplifier (not shown), thereby reading out data.

When data is read out of the memory cell M21 connected to the row line WL12, the row line WL12 is set to 0 V and the row line WL13 is set to 5 V, for example. At this time, the other row lines are set to 0 V. Thus, data can be read out of a desired memory cell in the same manner as described above. Moreover, to read data from the memory cell M31 connected to the row line WL13, the row line WL13 is set to 0 V, the row line WL11 is set, for example, to 5 V, and the other row lines are set to 0 V. As a result, data can be read out of the memory cell M31 as in the above case.

The above-described third embodiment can provide the same advantage as the first embodiment, and further can reduce the number of required contact holes, since one contact hole is commonly used for three memory cells.

FIGS. 18 and 19 show a fourth embodiment of the invention. In these figures, elements similar to those in FIG. 1 are denoted by corresponding reference numerals, and explanations will be given only of different elements. In this embodiment, the column lines BL12, BL13 and BL14 shown in FIG. 1 are not used. A common line CL1 extends along the row line WL11, and a common line CL2 is disposed between the row lines WL22 and WL31. These common lines CL1 and CL2 are connected to the column line BL11. The current paths of the memory cells 1, 2, 3 and 4 and the transistors 100, 101 and 102 are connected to the common line CL1. The currents paths of the memory cells 12, 13 and 14 and the transistors 110, 111, 112 and 113 are connected to the common line CL2. The current paths of the memory cells 15, 16, 17 and 18 and the transistors 114, 115 and 116 are connected to the common line CL2.

The operation of the non-volatile semiconductor memory device shown in FIGS. 18 and 19 will be explained. This non-volatile semiconductor memory device can rewrite data in units of each row line. To rewrite data, the column lines BL11, BL21, . . ., BL24 and the common lines CL1 and CL2 are set to 0 V. Then, a high voltage is applied to a row line connected to memory cells in which data are to be rewritten, and the other row lines are set to 0 V. Specifically, to rewrite data in the memory cells connected to the row line WL11, a high voltage is applied to the row line WL11. As a result, electrons are injected into the floating gate of each of the memory cells 1, 2, 3 and 4 connected to the row line WL11, thereby setting the threshold voltage of each memory cell to a positive level. In this state, one of the binary data elements, i.e. a 1 or 0, is written in each memory cell. Thereafter, electrons are selectively emitted from the floating gates of the memory cells, thereby setting the selected memory cell to a negative threshold voltage. Thus, the other binary data element, i.e. 0 or 1, is written in the selected memory cell.

An explanation will be given, for example, of a case where electrons are emitted from the floating gate of the memory cell 2 and kept at the floating gate of the memory cell 1. The row line WL11 is set to 0 V, and the common lines CL1 and CL2 are set to a predetermined voltage. When the row line WL12 and the column line BL22 have been set to a high voltage, a high voltage is applied to the drain of the memory cell 2 through the transistor 104, and electrons are emitted from the floating gate of the memory cell 2, thereby setting the threshold voltage of the memory cell 2 to a negative level. Since in the memory cell 6 having its gate and drain supplied with a high voltage, the difference in potential between the gate and the drain is small, no electrons are emitted. Further, since the gate of the transistor 101 is set at 0 V, the transistor is in the OFF-state. Thus, no current path is formed between the memory cell 6 and the transistor 101.

A high voltage is also applied to the gate of the memory cell 5 connected to the row line WL12. Since, however, a predetermined voltage is applied to the column line BL21, the potential difference between the floating gate of the memory cell 5 and the channel thereof or the drain thereof is not high enough to emit electrons from the floating gate. The predetermined voltage at the column line BL21 is applied to the memory cell 1 through the transistor 103. However, since the voltage applied to the memory cell 1 is not high enough to emit electrons from the floating gate thereof, the memory cell 1 is kept at its ion-injected state. The row lines WL21 and WL32 connected to the gates of the memory cells having their drains connected to the column lines BL11, BL21, . . ., BL24 are supplied with a predetermined voltage lower than the voltage supplied to the row line WL12. Therefore, the potential difference between the floating gate and the channel or drain of each of the memory cells 8, . . ., 11, 19, . . ., 21 is not high enough to emit electrons therefrom, and accordingly no electrons are emitted therefrom. Moreover, no electrons are emitted from the floating gates of the memory cells 12, . . ., 18 connected to the row lines WL22 and WL31, too. When, for example, the memory cell 12 connected to the row line WL22 has a negative threshold voltage after electrons are emitted from the floating gate of the memory cell 12, the potential of the common line CL2 connected to the drain of the memory cell 12 is set at a predetermined positive level. Therefore, the memory cell 12 is in the OFF-state, and no electrons flow from the column line BL21 to the common line CL2 through the transistor 107 which is in the ON-state. To keep a memory cell in the OFF-state, it suffices if the potentials of the common lines CL1 and CL2 are set to a level higher than the absolute value of the negative threshold voltage of the memory cell. Further, it is a matter of course that the potential of each of the common lines CL1 and CL2 need be set to a level which will not cause emission of electrons from the floating gate of the memory cell connected to the row line of 0 V to the common lines CL1 and CL2.

To emit electrons from the floating gate of a memory cell connected to the row line WL12, the row line WL12 is set to 0 V. A case where electrons are emitted from the floating gate of the memory cell 6 and kept at the floating gate of the memory cell 5 will be explained. Since in this case, the row line WL11 can be set to 0 V, no influence acts upon the memory cells connected to the row line WL11. If a high voltage is applied to the column line BL22, electrons are emitted from the floating gate of the memory cell 6 to the drain thereof, i.e., to the column line BL22, thereby setting the memory cell 6 to a negative threshold voltage. If the other row lines are set at the same potential as the above, no electrons are emitted from the floating gates of the memory cells connected to the other row lines. The column line BL21 connected to the memory cell 5 is set to such a potential as will not cause emission of electrons from the floating gate thereof and also flow of electrons between the floating gate of the memory cell 8 and that of the memory cell 19.

FIG. 20 shows a fifth embodiment of the invention. In FIG. 20, elements similar to those in FIG. 19 are denoted by corresponding reference numerals, and explanations will be given only of different elements. In the fourth embodiment, the column lines BL12, BL13 and BL14 are not used and a pair of adjacent blocks connected to a single row line are connected to a single column line. On the other hand, in the fifth embodiment, the column lines BL12, BL13 and BL14 are used and a pair of adjacent blocks connected to a single row line are connected to different column lines.

Specifically, the column line BL21 is connected to the current paths of the transistor 103, the memory cell 8 and the transistor 171. The column line BL12 is connected to the current paths of the memory cell 5, the transistor 107 and the memory cell 19. The column line BL22 is connected to the current paths of the transistor 104, the memory cell 9 and the transistor 118. The column line BL23 is connected to the current paths of the transistor 105, the memory cell 10 and the transistor 119. The column line BL14 is connected to the current paths of the memory cell 7, the transistor 109 and the memory cell 21. The column line BL24 is connected to the current paths of the transistor 106, the memory cell 11 and the transistor 120.

The operation of the non-volatile semiconductor memory device shown in FIG. 20 will be explained. This non-volatile semiconductor memory device can rewrite data in units of each row line. As in the case of the fourth embodiment, to rewrite data, the column lines BL11, BL21, . . ., BL24 and the common lines CL1 and CL2 are set to 0 V. Then, a high voltage is applied to a row line connected to memory cells in which data are to be rewritten, and the other row lines are set to 0 V. Specifically, to rewrite data in the memory cell connected to the row line WL11, a high voltage is applied to the row line WL11. As a result, electrons are injected into the floating gate of each of the memory cells 1, 2, 3 and 4 connected to the row line WL11, thereby setting the threshold voltage of each memory cell to a positive level. In this state, one of the binary data elements, i.e. a 1 or 0, is written in each memory cell. Thereafter, electrons are selectively emitted from the floating gates of the memory cells, thereby setting the selected memory cell to a negative threshold voltage. Thus, the other binary data element, i.e. 0 or 1, is written in the selected memory cell.

An explanation will be given, for example, of a case where electrons are emitted from the floating gate of the memory cell 2 and kept at the floating gate of the memory cell 1. The row line WL11 is set to 0 V, and the common lines CL1 and CL2 are set to a predetermined voltage. When the row line WL12 and the column line BL22 have been set to a high voltage, a high voltage is applied to the drain of the memory cell 2 through the transistor 104, and electrons are emitted from the floating gate of the memory cell 2, thereby setting the threshold voltage of the memory cell 2 to a negative level.

At this time, a high voltage is also applied to the gate of the memory cell 5 connected to the row line WL12. Since, however, a predetermined voltage is applied to the column line BL21, the potential difference between the floating gate of the memory cell 5 and the channel thereof or the drain thereof is not high enough to emit electrons from the floating gate. Further, a predetermined voltage lower than the potential of the row line WL12 is applied to the row line WL21 connected to the gate of the memory cell 9 whose drain is connected to the column line BL22. Since the potential difference between the floating gate of the memory cell 9 and the channel thereof or the drain thereof is not high enough to emit electrons, no electrons are emitted therefrom. The column line BL21 is set to a predetermined potential which will not cause emission of electrons from the floating gate of the memory cell 1, and also will not cause a change in the amount of electrons accumulated in the memory cell 8 whose gate is set to a predetermined potential. Furthermore, the predetermined potential of the column line BL21 is applied to the memory cell 1 through the transistor 103. However, since the voltage applied to the memory cell 1 is not high enough to emit electrons from the floating gate thereof, the memory cell 1 is kept at its ion-injected state. The row lines WL22 and WL31 adjacent to the common lines CL1 and CL2 are set to 0 V, and accordingly no electrons are emitted from the floating gates of the memory cells connected to the row lines WL22 and WL31, too. As in the FIG. 18 embodiment, the potential of each of the common lines CL1 and CL2 is set to a level higher than the absolute value of the negative threshold voltage of a memory cell.

To emit electrons from the floating gates of the memory cells 5, 6 and 7 connected to the row line WL12, the row line WL12 is set to 0 V. A case where electrons are emitted from the floating gate of the memory cell 6 and kept at the floating gate of the memory cell 5 will be explained. When a high voltage has been applied to the column line BL13, electrons are emitted from the floating gate of the memory cell 6 to the drain thereof, i.e., to the column BL13, and the threshold voltage of the memory cell 6 comes to a negative level. Since the row line WL11 can be set to 0 V, no influence acts upon the memory cells connected to the row line WL11. A row line (e.g. the row line WL32) connected to the gate of a memory cell (e.g. the memory cell 20) whose drain is directly connected to the column line BL13 is set to such a voltage as will not influence the electron-accumulation state of the floating gate of the memory cell. The column line BL12 is set to such a predetermined potential as will not cause emission of electrons from the memory cell 5, and also will not cause a change in the electrons-accumulated state of the memory cell 19 whose gate is set at a predetermined potential.

As in the case of writing data into an EPROM memory cell, the FIG. 20 embodiment can selectively write data into a memory cell also by making a current flow into the channel region of the memory cell and injecting electrons created during the current flow, into the floating gate of the same. In this case, first, electrons are emitted from a memory cell to set the memory cell to a negative threshold voltage. Setting of the memory cell to a negative threshold voltage can be realized by the following two methods:

According to a first method, while the row lines are set to 0 V, for example, the semiconductor substrate in which memory cell are formed is set to a high voltage, and the tunnel effect is used to emit electrons from the floating gates of the memory cells to the semiconductor substrate, thereby setting all the memory cells to a negative threshold voltage. According to a second method, contrary to the first method, while the semiconductor substrate is set to 0 V, all the row lines are set to a negative voltage, thereby emitting electrons from the floating gates of the memory cells to the substrate. If only a voluntary row line is set to a negative voltage, electrons are emitted only from memory cells connected to the row line, with the result that the memory cells connected to the voluntary row line are set to a negative voltage. Thereafter, electrons are injected into the memory cells connected to the voluntary row line, thereby rewriting data in the memory cells connected thereto.

In FIG. 20, to inject electrons into the floating gate of the memory cell 5, the row lines WL11 and WL12 are set to a predetermined voltage, while the other row lines are set to 0 V. In this state, a predetermined voltage is applied to the column line BL12 connected to the memory cell 5, and the other column lines and the common lines CL1 and CL2 are set to 0 V. As a result, a current flows only through the memory cell 5 and the transistor 100, thereby injecting electrons into its floating gate. Since no current flows into the other memory cells, the states of their floating gates do not change. Similarly, to inject electrons into the memory cell 12, the row lines WL21 and WL22 are set to a predetermined voltage, and a predetermined voltage is applied to the column line BL12. As a result, a current flows only through the transistor 107 and the memory cell 12, thereby injecting electrons into its floating gate. Thus, electrons are selectively injected.

The above-described fourth and fifth embodiments can provide the same advantage as the first embodiment. Further, the fourth embodiment can reduce the number of required column lines.

What is claimed is:

1. A non-volatile semiconductor memory device comprising:

a first row line;

a first memory cell connected at one end to a first column line and selectively driven by said first row line;

a first transistor connected at one end to a second column line and selectively driven by said first row line;

a second row line;

a second transistor connected at one end to the other end of said first memory cell, connected at the other end to a third column line and selectively driven by said second row line; and a second memory cell connected at one end to the other end of said first transistor, connected at the other end to said third column line and selectively driven by said second row line.

2. A device according to claim 1, in which each of said first and second memory cells has a floating gate and a control gate and which further comprises first programming means for setting the control gates of said first and second memory cells to a high voltage which is positive with respect to the potential of a semiconductor substrate in which said first and second memory cells are formed by supplying a high voltage to said first and second row lines to inject electrons into the floating gates thereof and set said first and second memory cells into the first data storing state; and second programming means for setting the control gate of said first or second memory cell to a negative voltage by supplying a voltage which is negative with respect to the potential of said semiconductor substrate to said first or second row line and selectively supplying a voltage which is positive with respect to the potential of said semiconductor substrate to said first or third column line to selectively emit electrons from the floating gate thereof, thus setting said first or second memory cell into the second data storing state to program said first or second memory cell into the first or second data storing state.

3. A device according to claim 1, in which each of said first and second memory cells has a floating gate and a control gate and which further comprises first programming means for setting the control gates of said first and second memory cells to a high voltage which is negative with respect to the potential of a semiconductor substrate in which said first and second memory cells are formed by supplying the negative high voltage to said first and second row lines to emit electrons from the floating gates thereof and set said first and second memory cells into the first data storing state; and second programming means for setting the control gate of said first memory cell to a voltage which is positive with respect to the potential of said semi-conductor substrate by supplying the positive voltage to said first row line and supplying a first preset voltage or a second preset voltage which is higher than the first preset voltage to said first column line, and programming said first memory cell into the first or second data storing state by injecting electrons into the floating gate of said first memory cell to set said first memory cell into the second data storing state when the first preset voltage is supplied and keeping said first memory cell in the first data storing state when the second preset voltage is supplied.

4. A device according to claim 1, wherein the gate insulation film disposed between the floating gate and the channel region of each of said first and second memory cells is thinner than the gate insulation film of each of said first and second transistors.

5. A non-volatile semiconductor memory device comprising:

a first row line;

a first memory cell connected at one end to a first column line and selectively driven by said first row line;

a first transistor connected at one end to a second column line and selectively driven by said first row line;

a second row line;

a second transistor connected at one end to the other end of said first memory cell, connected at the other end to a third column line and selectively driven by said second row line; and a second memory cell connected at one end to the other end of said first transistor, connected at the other end to said third column line and selectively driven by said second row line;

a third row line;

a third memory cell connected at one end to said third column line and selectively driven by said third row line;

a third transistor connected at one end to said third column line and selectively driven by said third row line;

a fourth row line;

a fourth transistor connected at one end to the other end of said third memory cell, connected at the other end to said first column line and selectively driven by said fourth row line;

a fourth memory cell connected at one end to the other end of said third transistor, connected at the other end to said second column line and selectively driven by said fourth row line;

each of said first to fourth memory cells having a floating gate and a control gate;

first programming means for setting the control gates of said first to fourth memory cells to a first high voltage which is negative with respect to the potential of a semiconductor substrate in which said memory cells are formed by supplying the first negative high voltage to said first to fourth row lines to emit electrons from the floating gates thereof and set said first to fourth memory cells into the first data storing state; and second programming means for selectively setting the control gates of said first to fourth memory cells to a voltage which is positive with respect to the potential of said semiconductor substrate by selectively supplying the positive voltage to said first to fourth row lines and selectively supplying a first preset voltage or a second preset voltage which is higher than the first preset voltage to a preset one of said first to third column lines, and programming said first to fourth memory cells into the first or second data storing state by injecting electrons into the floating gate of the selected memory cell to set the memory cell into the second data storing state when the first preset voltage is supplied and keeping the selected memory cell in the first data storing state when the second preset voltage is supplied.

6. A device according to claim 5, further comprising voltage setting means for setting said row line forming the control gate of the memory cell which is set in the non-selected state and connected to the column line supplied with the first or second preset voltage to a positive voltage lower than said positive voltage.

7. A non-volatile semiconductor memory device comprising:

a first row line;

a first memory cell whose threshold voltage is set at a negative or positive value and which is connected at one end to a first column line and selectively driven by said first row line;

a second row line;

a first transistor connected at one end to the other end of said first memory cell, connected at the other end to a second column line and selectively driven by said second row line, for creating a current path for electrically connecting said first column line and said second column line together with said first memory cell when the threshold voltage of said first memory cell is set at a negative value;

a second memory cell whose threshold voltage is set to a negative or positive value and which is connected at one end to said second column line and selectively driven by said second row line; and a second transistor connected at one end to the other end of said second memory cell, connected at the other end to a third column line and selectively driven by said first row line, for creating a current path for electrically connecting said third column line and said second column line together with said second memory cell when the threshold voltage of said second memory cell is set at a negative value.

8. A non-volatile semiconductor memory device comprising:

a first row line;

a first memory cell having a current path and selectively driven by said first row line, the current path of said first memory cell having one end connected to a first column line;

a first transistor having a current path and selectively driven by said first row line, the current path of said first transistor having one end connected to a second column line;

a second row line;

a second transistor having a current path and selectively driven by said second row line, the current path of said second transistor having one end connected to the other end of the current path of said first memory cell, and the other end connected to a third column line; and a second memory cell having a current path and selectively driven by said second row line, the current path of said second memory cell having one end connected to the other end of the current path of said first transistor, and the other end connected to a fourth column line.

9. A device according to claim 8, wherein each of said first and second memory cells has a floating gate and a control gate, and further comprising:

first program means for supplying a high voltage to said first and second row lines to set said control gate of each of said first and second memory cells to a positive high voltage relative to a semiconductor substrate in which said first and second memory cells are formed, thereby injecting electrons into said floating gates of said first and second memory cells to cause said first and second memory cells to enter a first data-storage state; and second program means for supplying said first or second row line with a negative voltage relative to said semiconductor substrate to set said control gate of said first or second memory cell to a negative voltage, and for selectively supplying said third or fourth column line with a positive voltage relative to said semiconductor substrate to selectively emit electrons from said floating gates of said first and second memory cells to cause said first or second memory cell to be in a second data-storage state, thereby programming such that said first or second memory cell enters said first or second data-storage state.

10. A non-volatile semiconductor memory device comprising:

a first row line;

a first memory cell having a current path and selectively driven by said first row line, the current path of said first memory cell having one end connected to a first column line;

a first transistor having a current path and selectively driven by said first row line, the current path of said first transistor having one end connected to said first column line;

a second row line;

a second transistor having a current path and selectively driven by a second row line, the current path of said second transistor having one end connected to the other end of the current path of said first memory cell, and the other end connected to said second column line;

a second memory cell having a current path and selectively driven by said second row line, the current path of said second memory cell having one end connected to said first column line;

a third row line;.

a third transistor having a current path and selectively driven by said third row line, the current path of said third transistor having one end connected to the other end of the current path of said second memory cell, and the other end connected to said second column line; and a third memory cell having a current path and selectively driven by said third row line, the current path of said third memory cell having one end connected to the other end of said first transistor, and the other end connected to said second column line.

11. A device according to claim 8, wherein each of said first through third memory cells has a floating gate and a control gate, and further comprising:

first program means for supplying a high voltage to said first through third row lines to set said control gate of each of said first through third memory cells to a positive high voltage relative to a semi-conductor substrate in which said first through third memory cells are formed, thereby injecting electrons into said floating gates of said first through memory cells to set said first through third memory cells in a first data-storage state; and second program means for supplying one of said first through third row lines with a negative voltage relative to said semiconductor substrate to select said one of said first through third memory cells, and for selectively supplying said first or second column lines with a positive voltage relative to said semiconductor substrate to selectively emit electrons from said floating gates of said selected memory cell, thereby programming such that said selected memory cell enters a second data-storage state.

12. A non-volatile semiconductor memory device comprising:

a first column line;

a first row line;

a common line connected to the first column line and extending along the first row line;

a first memory cell having a current path and selectively driven by said first row line, the current path of said first memory cell having one end connected to said common line;

a first transistor having a current path and selectively driven by said first row line, the current path of said first transistor having one end connected to said common line;

a second row line;

a second transistor having a current path and selectively driven by said second row line, the current path of said second transistor having one end connected to the other end of the current path of said first memory cell, and the other end connected to a second column line; and a second memory cell having a current path and selectively driven by said second row line, the current path of said second memory cell having one end connected to the other end of the current path of said first transistor, and the other end connected to said second column line.

13. A device according to claim 12, wherein each of said first and second memory cells has a floating gate and a control gate.

14. A device according to claim 13, further comprising:

first program means for programming said first memory cell connected to said first row line, said first program means setting said first and second column lines and said common line to a ground potential, applying a high voltage to said first row line, setting said second row line to the ground potential, thereby injecting electrons into the floating gate of said first memory cell to store therein one of logic data elements; and second program means for storing the other unit of said logic data in said first memory cell with the use of said second column line, said second program means setting said common line and said first row line to a predetermined positive potential and the ground potential, respectively, applying a high voltage to said second row line and said second column line, thereby turning on said second transistor, emitting electrons from the floating gate of said first memory cell to said second column line through said second transistor, to store the other of said logic data elements in said first memory cell.

15. A non-volatile semiconductor memory device comprising:

a first column line;

a first row line;

a common line connected to said first column line and extending along said first row line;

a first memory cell having a current path and selectively driven by said first row line, the current path of said first memory cell having one end connected to said common line;

a first transistor having a current path and selectively driven by said first row line, the current path of said first transistor having one end connected to said common line;

a second row line;

a second transistor having a current path and selectively driven by said second row line, the current path of said second transistor having one end connected to the other end of the current path of said first memory cell, and the other end connected to a second column line; and a second memory cell having a current path and selectively driven by said second row line, the current path of said second memory cell having one end connected to the other end of the current path of said first transistor, and the other end connected to a third column line.

16. A device according to claim 15, wherein each of said first and second memory cells has a floating gate and a control gate.

17. A device according to claim 13, further comprising:

first program means for programming said first memory cell connected to said first row line, said first program means setting said first and second column lines and said common line to a ground potential, applying a high voltage to said first row line, setting said second row line to the ground potential, thereby injecting electrons into the floating gate of said first memory cell to store therein one of logic data elements; and second program means for storing the other unit of said logic data elements in said first memory cell with the use of said second column line, said second program means setting said common line and said first row line to a predetermined positive potential and the ground potential, respectively, applying a high voltage to said second row line and said second column line, thereby turning on said second transistor, emitting electrons from the floating gate of said first memory cell to said second column line through said second transistor, to store the other of said logic data elements in said first memory cell.

18. A device according to claim 16, further comprising:

first program means for setting said first and second row lines to the ground potential, applying a high voltage to a semiconductor substrate, emitting electrons from the floating gate of each of said first and second memory cells, thereby setting said first and second memory cells to a negative threshold voltage; and second program means for programming said second memory cells, said second program means applying a predetermined positive voltage to said first and second row lines, applying a predetermined positive voltage to said third column line, setting remaining column lines and said common line to the ground potential, thereby allowing a current to flow from said third column line to said common line through said second memory cell and said second transistor, to inject electrons into the floating gates of said second memory cell to set said second memory cell to a positive threshold voltage.

19. A device according to claim 16, further comprising:

first program means for applying a negative voltage to said first and second row lines, setting a semiconductor substrate to a ground potential, thereby emitting electrons from the floating gates of said first and second memory cells to set said first and second memory cells to a negative threshold voltage;

second program means for programming said second memory cells, said second program means applying a predetermined positive voltage to said first and second row lines, applying a predetermined positive voltage to said third column line, setting remaining column lines and said common line to the ground potential, thereby allowing a current to flow from said third column line to said common line through said second memory cell and said second transistor, to inject electrons into the floating gates of said second memory cell to set said second memory cell to a positive threshold voltage.

* * * * *